(12) United States Patent  (10) Patent No.: US 12,124,170 B2
Clube et al.  (45) Date of Patent: Oct. 22, 2024

(54) METHOD AND APPARATUS FOR PRINTING A PERIODIC PATTERN WITH A VARYING DUTY CYCLE

(71) Applicant: EULITHA AG, Kirchdorf (CH)

(72) Inventors: Francis Clube, Windisch (CH); Andreas Amrein, Zurich (CH); Maxime Lebugle, Villigen (CH); Harun Solak, Untersiggenthal (CH); Li Wang, Brugg (CH)

(73) Assignee: Eulitha AG, Kirchdorf (CH)

( * ) Notice: Subject to any disclaimer, the term of this patent is extended or adjusted under 35 U.S.C. 154(b) by 600 days.

(21) Appl. No.: 17/598,409

(22) PCT Filed: Mar. 27, 2020

(86) PCT No.: PCT/IB2020/052954
§ 371 (c)(1),
(2) Date: Sep. 27, 2021

(87) PCT Pub. No.: WO2020/194267
PCT Pub. Date: Oct. 1, 2020

(65) Prior Publication Data
US 2022/0155691 A1    May 19, 2022

Related U.S. Application Data

(60) Provisional application No. 62/824,508, filed on Mar. 27, 2019, provisional application No. 62/923,744, filed on Oct. 21, 2019.

(51) Int. Cl.
*G03F 7/00* (2006.01)
*G03F 1/70* (2012.01)

(52) U.S. Cl.
CPC ............ *G03F 7/70408* (2013.01); *G03F 1/70* (2013.01)

(58) Field of Classification Search
CPC .............................. G03F 1/70; G03F 7/70408
USPC ......................................................... 430/30
See application file for complete search history.

(56) References Cited

U.S. PATENT DOCUMENTS

| 6,580,529 | B1 | 6/2003 | Amitai et al. |
| 8,617,775 | B2 * | 12/2013 | Solak ........................ G03F 1/70 430/326 |
| 9,182,672 | B2 * | 11/2015 | Solak .................. G03F 7/70408 |
| 11,837,470 | B2 * | 12/2023 | Lee ..................... H01L 21/0275 |
| 2009/0128911 | A1 | 5/2009 | Itzkovitch et al. |
| 2012/0292635 | A1 | 11/2012 | Iketani et al. |
| 2016/0033784 | A1 | 2/2016 | Levola et al. |

FOREIGN PATENT DOCUMENTS

| CN | 105259739 A | 1/2016 |
| WO | 2006045439 A2 | 5/2006 |
| WO | 2012164539 A1 | 12/2012 |

OTHER PUBLICATIONS

Clube F S M et al., "Displacement talbot lithography for the manufacture of distributed feedback and distributed Bragg reflector lasers", 2016 International Conference Laser Optics (LO), IEEE, Jun. 27, 2016, XP 032948352, the whole document.

* cited by examiner

*Primary Examiner* — Christopher G Young
(74) *Attorney, Agent, or Firm* — Laurence A. Greenberg; Werner H. Stemer; Ralph E. Locher

(57) ABSTRACT

A method for forming a surface-relief grating with a desired spatial variation of duty cycle in a layer of photoresist includes: providing a first mask bearing a high-resolution grating of linear features, arranging the first mask at a first distance from a substrate, providing a second mask bearing a variable-transmission grating of opaque and transparent linear features that has a designed spatial variation of duty cycle, arranging the second mask at a distance before the first mask such that the linear features of the variable-transmission grating are orthogonal to the linear features of the high-resolution grating, illuminating the second mask while varying the first distance according to displacement Talbot lithography and also displacing the second mask at an angle to its linear features such that there is substantially no component of modulation with the period of the variable-transmission grating in the energy density distribution that exposes the photoresist.

20 Claims, 16 Drawing Sheets

METHOD AND APPARATUS FOR PRINTING A PERIODIC PATTERN WITH A VARYING DUTY CYCLE

FIELD AND BACKGROUND OF THE INVENTION

This invention relates generally to the field of photolithography as employed for the fabrication of micro- and nano-structures, and it particularly relates to the field of photolithography used for the fabrication of near-eye displays.

Diffractive optical elements (DOEs) and holographic optical elements (HOEs) are being widely developed for augmented-reality (AR) and virtual-reality (VR) display applications. The compact and lightweight properties of DOEs and HOEs offer clear advantages for realising portable and unobtrusive head-mounted devices with the required functionalities. The structures that are attracting the most attention are surface-relief gratings because of their potential for lower manufacturing costs, and the periods of the structures required are in the range 250-500 nm. Typically, the structures are employed, firstly, to couple light from an image-generating micro-display into the transparent substrate of the AR-glasses; secondly, to redistribute the light to an area of the glasses in front of the viewer's eye; and, finally, to couple the light out of the glasses so that a virtual image is seen superposed on the wearer's view of the real world. The gratings are commonly referred to as waveguide gratings because they channel the light so that it travels by multiple internal reflections between the two surfaces of the substrate. Ideally, the design of the gratings enables a full-colour image to be seen over a wide field of view and focused at a comfortably large distance.

U.S. Pat. No. 6,580,529 discloses a method for enlarging the exit pupil of a virtual image display, in which 3 holographically recorded diffraction gratings are arranged on a planar, transparent substrate. With reference to FIG. 1, light from a display source is incident on a first holographic optical element (HOE), H1, that is located on one surface of the substrate. H1 couples the display light into the substrate, where it is then trapped by total internal reflection between the substrate surfaces, and directs the light towards the second HOE, H2. H2 expands the extent of the light distribution in the x direction and redirects the light towards the third HOE, H3. H3 then expands the width of the light distribution in the y direction and decouples the light from the substrate towards a viewer's eye. The expansion of the light distribution in the x and y directions by H2 and H3 allow the viewer to see a virtual image of the display source with a large field of view. It describes that the expansions performed by H2 and H3 occur by multiple reflections of the illuminating light between the gratings and the opposite surface of the substrate with the light being partly diffracted towards respectively H3 and the viewer each time it is incident on the gratings concerned. It further discloses that in order for the out-coupled light to have uniform intensity over the area of H3, the diffraction efficiencies of the H2 and H3 should not be constant over their areas but should increase non-linearly in the x and y directions respectively.

Eisen et al., "Planar configuration for image projection", Appl. Opt., vol. 45, no. 17 (2006) and Gurwich et al., "Design and experiments of planar optical light guides for virtual image displays", Proc. SPIE vol. 5182, Wave-Optical Systems Engineering II (2003) disclose procedures for designing and fabricating the gratings H1, H2 and H3 employed in the above-described exit-pupil-enlarging scheme. In particular, they disclose that the grating periods required are 450 nm for gratings H1 and H3, and 318 nm for grating H2. In order that the diffraction efficiencies are high it discloses that the groove shape of H2 should be symmetric whereas for gratings H1 and H3 the grooves should have particular slant angles. The non-linear variations of diffraction efficiency required along gratings H2 and H3 for ensuring a uniform image brightness are calculated for a particular set of system parameters of illumination wavelength, period of grating, substrate thickness, etc; and rigorous coupled wave theory is used to determine the variation of groove depth required along the grating to obtain these efficiency variations. Holographic recording procedures are disclosed for obtaining the required groove slant angles in gratings H1 and H3 and for obtaining the required variations of groove depth across the gratings. The latter procedure includes characterising the dependence of groove depth on exposure dose and realising the variation of exposure dose across the exposure area by a gradual displacement of an opaque mask during the exposure.

U.S. patent application Ser. No. 11/991,492 discloses an alternative method for obtaining a non-linear variation of diffraction efficiency along gratings incorporated in virtual imaging devices for the same purpose as explained above. It discloses that the desired variation of diffraction efficiency may be obtained instead by a variation of the duty cycle of the surface-relief grating along its length, where the duty cycle is defined as the ratio of the width of a ridge in the grating to the grating period. It discloses that the dependence of diffraction efficiency on duty cycle (for particular illumination wavelength, grating period, etc) is numerically calculated based on Maxwell's equations, which then allows the duty-cycle variation to be determined for obtaining the desired non-linear variation of diffraction efficiency along the grating. It teaches that surface-relief gratings with the required period of 455 nm and desired variation of duty-cycle may be fabricated on transparent substrates using electron-beam lithography followed by an etching process. It discloses also that the variation of diffraction efficiency along a surface-relief grating may be alternatively obtained by varying both the duty-cycle and depth of the grating profile along the length of the grating.

U.S. patent application Ser. No. 14/447,419 describes various optical components that have a surface-relief grating composed of a series of grooves on the surface of a transparent substrate in which one of the linewidth, depth or slant angle of the grooves gradually varies in one direction across the grating and another one of the linewidth, depth and slant angle gradually varies in another direction across the grating. The gratings concerned are particularly for coupling light in and out of light-guide-based display systems that transport light of a desired image from a light engine to an eye, i.e. for AR and VR applications. It states that the periods of the gratings are typically in the range 250-500 nm, and teaches a variety of techniques for fabricating surface-relief gratings such that the linewidth, depth or slant angle of the grooves varies gradually in a desired manner and in a particular direction across the grating. For example, a uniform surface-relief grating is first formed on the surface of a fused silica substrate using conventional photolithographic and etching techniques. A gradual variation of the depth and linewidth of the grooves is then produced across the grating by lowering the substrate slowly into a container of etching fluid such that the time to which different parts of the grating are immersed in the etchant varies across the grating to produce the desired result. In another example, a uniform grating is first formed, using conventional photolithographic and etching techniques, in a chrome layer on the surface of a fused silica substrate such that residual unexposed photoresist remains on the tops of the chrome lines. The substrate is then lowered with a controlled speed into a container of etchant that etches the chrome lines below the photoresist so that a required variation of chrome linewidth is produced along the grating. Following this, the residual photoresist is removed and the fused silica substrate between the chrome lines is uniformly reactive-ion etched with the substrate tilted at a suitable angle with respect to the direction of the ion beam. This enables a surface-relief grating to be formed with linewidths that vary across the grating and with grooves that have a desired slant angle. In another example, a uniform grating is first produced in a layer of chrome on a fused silica substrate using conventional techniques. The grating is then ion-beam etched whilst displacing an aperture with a variable speed above the grating such that the time during which the grating is locally exposed to the etching ions varies across the grating, whereby a desired gradual variation of groove depth across the grating is produced. In another example, the tilt angle of the substrate is additionally varied as the aperture displaces above the grating with constant speed such that a desired variation of groove slant angle is produced across the grating.

Although the prior art discloses a multitude of techniques for realising surface-relief gratings with sub-micron periods that have desired spatial variation of diffraction efficiency required across their area to enable uniform image brightness in AR and VR virtual reality displays, none of the techniques is well suited for low-cost volume manufacturing. In particular, electron-beam lithography is too slow and expensive for forming a variation of groove linewidth, or duty cycle, across the grating; a holographic exposure system is very sensitive to environmental stability and vibrations so is impractical for reliable and high-throughput production; and lowering a substrate gradually into etching fluid and removing the fluid are cumbersome and result in poor reproducibility. Optical stepper and scanner photolithographic equipment, as are generally employed by the microelectronics industry for manufacturing processing and memory chips, have the resolution capability for the AR/VR applications but the size of their exposure fields is too small for the dimensions of virtual image displays (typically 40-50 mm). Nanoimprinting is unattractive for high-volume production because of defect issues inherent with this technology.

SUMMARY OF THE INVENTION

It is therefore a first object of the present invention to provide a photolithographic method and apparatus for printing a surface-relief grating pattern, especially one with sub-micron period, into a layer of photoresist coated either directly or indirectly on a substrate such that the duty cycle of the grating varies in a single direction across the pattern according to desired one-dimensional variation, the duty cycle being constant across the pattern in the orthogonal direction.

It is a second object of the present invention to provide a photolithographic method and apparatus for printing a surface-relief grating, especially one with sub-micron period, into a layer of photoresist coated either directly or indirectly on a substrate such that the duty cycle of the grating varies across the pattern in two orthogonal directions according to a desired two-dimensional variation.

It is a third object of the present invention to provide a photolithographic method and apparatus for printing a surface-relief grating pattern, especially one with sub-micron period, into a layer of photoresist coated either directly on a substrate, or coated indirectly with one of more intermediate layers of one or more other materials between the photoresist and the substrate, such that the duty cycle of the grating varies across the pattern according to a desired one-dimensional or two-dimensional variation, so that the surface-relief grating printed in the layer of photoresist can be further processed to form a surface-relief grating in either the material of the underlying substrate or in the material of one of the intermediate layers, whereby the $1^{st}$-order diffraction efficiency of the surface-relief grating thus formed has a desired respectively one-dimensional or two-dimensional variation across the substrate when illuminated in a virtual reality or augmented reality imaging system.

According to a first aspect of the present invention there is provided a method based on displacement Talbot lithography for forming a desired surface-relief grating of periodic linear features having a desired spatial variation of duty cycle in a layer of photoresist on a substrate, which method comprises:

a) providing a first mask bearing a first high-resolution grating of linear features with a period that is twice that of the desired surface-relief grating;

b) arranging the substrate and first mask in a displacement Talbot lithographic system such that the first mask is parallel to and at a first distance from the substrate;

c) providing a second mask bearing a first variable-transmission grating of alternating opaque and transparent linear features that has a period and a designed spatial variation of duty cycle;

d) arranging said second mask parallel to and at a second distance from the first mask on the opposite side of the first mask to that at the first distance from the substrate, and such that the linear features of the first variable-transmission grating are orthogonal to the linear features of the first high-resolution grating;

e) generating a beam of monochromatic light for illuminating the second mask such that the light incident on the second mask is well-collimated in the plane of incidence that is parallel to the linear features of the first variable-transmission grating, and has a pre-determined distribution of angles of incidence in the plane that is orthogonal to the linear features of the first variable-transmission grating so that the diffracted beams transmitted by said first variable-transmission grating illuminate the first high-resolution grating;

f) illuminating for an exposure time the second mask with said beam while varying the first distance according to displacement Talbot lithography, whereby the light-field transmitted by the first high-resolution grating exposes the photoresist to an energy density distribution for forming said desired surface-relief grating;

wherein the spatial variation of duty cycle in the first variable-transmission grating is designed based on a pre-determined dependence of the duty cycle of a surface-relief grating formed using displacement Talbot lithography on the energy density of the beam illuminating the first mask in the absence of said second mask and according to the spatial variation of duty cycle of the desired surface-relief grating;

wherein said second distance and said pre-determined distribution of angles of incidence are selected in relation to the period of the first variable-transmission grating so that there is substantially no component of modulation with the period of the first variable-transmission grating in the energy density distributions that expose the first high-resolution grating and photoresist in the exposure time.

Most preferably the period of the linear features in the first linear variable transmission grating is constant over the area of the grating though alternatively it may vary.

According to a second aspect of the present invention there is provided a method based on displacement Talbot lithography for forming a desired surface-relief grating of periodic linear features having a desired spatial variation of duty cycle in a layer of photoresist on a substrate, which method comprises:
  a) providing a first mask bearing a first high-resolution grating of linear features with a period that is twice the period of the desired surface-relief grating;
  b) arranging said first mask parallel to and at a first distance from the substrate;
  c) providing a second mask bearing a first variable-transmission grating of alternating opaque and transparent linear features that has a period and a designed spatial variation of duty cycle;
  d) arranging said second mask parallel to and at a second distance from the first mask on the opposite side of the first mask to that at the first distance from the substrate, and such that the linear features of the first variable-transmission grating are orthogonal to the linear features of the first high-resolution grating;
  e) generating a beam of monochromatic light for illuminating the second mask such that the light incident on the second mask is well-collimated in the plane of incidence that is parallel to the linear features of the first variable-transmission grating, so that the diffracted beams transmitted by said first variable-transmission grating illuminate the first high-resolution grating;
  f) illuminating for an exposure time the second mask with said beam while varying the first distance according to displacement Talbot lithography and displacing the second mask, whereby the light-field transmitted by the first high-resolution grating exposes the photoresist to an energy density distribution for forming said desired surface-relief grating;
  wherein the displacement of the second mask is arranged in relation to the period and direction of the linear features of the first variable-transmission grating such that there is substantially no component of modulation with the period of the first variable-transmission grating in the energy density distributions that expose first high-resolution grating and the photoresist in the exposure time;
  wherein the spatial variation of duty cycle in the first variable-transmission grating is designed based on a pre-determined dependence of the duty cycle of a surface-relief grating formed using displacement Talbot lithography on the energy density of the beam illuminating the first mask in the absence of the second mask and according to the spatial variation of duty cycle of the desired surface-relief grating.

Most preferably the period of the linear features in the first linear variable transmission grating is constant over the area of the grating though alternatively it may vary.

If the desired spatial variation of duty cycle in the surface-relief grating is one-dimensional, that is, varies in a single direction across the grating and is constant in the orthogonal direction, then the spatial variation of duty cycle designed in the variable-transmission, or half-tone, grating is correspondingly one-dimensional. If the one-dimensional desired variation of duty cycle across the surface-relief grating is in a direction orthogonal to the linear features of the grating then the direction of one-dimensional variation of duty cycle of the linear features in the variable-transmission grating is correspondingly parallel to the linear features of that pattern. Alternatively, if the one-dimensional desired variation of duty cycle across the surface-relief grating is in a direction parallel to the linear features of the grating then the direction of one-dimensional variation of duty cycle of the linear features in the variable-transmission grating is correspondingly orthogonal to the linear features of that pattern. If, on the other hand, the direction of desired one-dimensional variation of duty cycle in the surface-relief grating is neither parallel nor orthogonal to the linear features of the grating but at an intermediate angle, then the direction of one-dimensional variation of duty cycle in the variable-transmission grating is at the corresponding intermediate angle with respect to the linear features of that pattern.

The function of the second mask bearing alternating opaque and transparent linear features is to deliver a position dependent (that is spatially variable) exposure dose to the said first mask. This is achieved by changing locally the ratio of the widths of opaque and transparent linear features. This ratio is chosen to provide a desired local average transmission. This can be achieved by a set of linear features that have a constant period and varying duty cycle. However, the constant period is not a necessary feature of this variable transmission mask. For example, one can achieve an equivalent result with a mask bearing linear transparent features with a constant width and linear opaque features with variable width, i.e. by varying the period (local period=width of transparent feature+width of neighbouring opaque feature). Likewise, one can use a mask where the transparent and opaque features have respectively variable and constant widths (again implying a period that varies over the grating). Alternatively, both widths can vary as a function of position while providing a desired average transmission value locally. Advantageously, however, the (local) period of the variable-transmission grating employed in the first and second aspects of the invention (as well as in the third and fourth aspects below) is constant over the grating area rather than varying because it simplifies the design of the variable-transmission grating, allows a higher resolution of duty cycle variation to be obtained in the surface-relief grating printed in the photoresist. A constant period also facilitates and enables a better suppression of the component of exposure dose illuminating the mask that is introduced by the local period (and binary nature) of the variable-transmission mask using either the pre-determined angular bandwidth of the illumination beam in the first aspect or the displacement of the variable-transmission mask in the second aspect. If the period is varying it should preferably do so slowly, or gradually, such that it is nearly periodic, or quasi-periodic, (e.g. period varying by <10%) over any elemental region of the grating, for example, over a region that is much smaller (<10%) than the dimension of the grating in the direction orthogonal to the linear features of the variable transmission grating. Too large a rate of change of period would introduce an undesirable component of non-uniformity into the intensity distribution illuminating the fine-grating pattern.

The desired one-dimensional variation of duty cycle in the surface-relief grating may be linear, that is, increasing or decreasing with a constant gradient across the grating, or may be non-linear, monotonic or non-monotonic, in any of which cases the one-dimensional variation of duty cycle in the variable-transmission grating is correspondingly designed based also on a pre-determined dependence of the duty cycle of the surface-relief grating on the energy density to which the first mask is exposed when illuminated by the beam in the absence of the second mask.

If the desired spatial variation of duty cycle in the surface-relief grating is two-dimensional, that is, it varies in orthogonal directions across the grating, then the spatial variation of duty cycle in the variable-transmission grating is correspondingly two-dimensional. As for a one-dimensional variation of duty cycle, the desired two-dimensional variation of duty cycle of the surface-relief grating may have a component of variation in each direction that is linear, non-linear, monotonic or non-monotonic, or any combination of these.

Preferably, the dimensions of the variable-transmission grating are larger than those of the first periodic pattern so that the complete area of the high-resolution grating pattern is illuminated by all diffracted orders having significant relative intensity transmitted by the variable-transmission grating in order to avoid introducing an undesired component of exposure energy variation near the edges of the first high-resolution grating pattern.

The layer of photoresist over the substrate is either directly on the substrate, or indirectly, with at least one intermediate layer of another or other materials. Advantageously, an intermediate layer of another material, such as a metal, is between photoresist and substrate, which may be subsequently etched so that the spatial variation of duty cycle is transferred from the surface-relief grating in photoresist into the metal layer, and the underlying substrate is then etched through the hard-mask structure of the patterned metal layer so as to transfer the spatial variation of duty cycle into the substrate material.

Advantageously, the method according to the second aspect of the present invention is additionally for printing a plurality of surface-relief gratings with a plurality of desired periods and with at least one desired spatial variation of duty cycle in at least one for the gratings into a layer of photoresist over a substrate, the individual gratings being printed either simultaneously or sequentially. If the former, the first mask additionally bears at least a second high-resolution grating of linear features with a second period that is twice the desired period of the at least second surface-relief grating; the second mask additionally bears at least a second variable-transmission grating of linear features comprising openings in the opaque layer on a substrate, having a period that is substantially larger than that of the at least second high-resolution grating, and having a duty cycle that is constant or has a designed spatial variation that corresponds to the desired spatial variation of duty cycle of the at least second surface-relief grating; the beam of monochromatic light is generated for additionally illuminating the at least second variable-transmission grating and such that the beam is well-collimated in the plane of incidence that is parallel to the direction of the linear features of the at least second variable-transmission grating; the beam additionally illuminates for the exposure time the at least second variable-transmission grating such that the beam transmitted by the second mask additionally illuminates the at least second high-resolution grating in the first mask while the separation of the first mask and the photoresist-coated substrate is varied according to displacement Talbot lithography; and the second mask is displaced at an angle with respect to the direction of the linear features of both the first and at least second variable-transmission gratings during the illumination of the first and at least second variable-transmission gratings, such that the components of intensity modulation in the beam transmitted by the first and at least second variable-transmission gratings that corresponds to the periods of the first and at least second variable-transmission gratings are substantially eliminated from the energy density distributions to which the first and at least second high-resolution gratings are exposed in the exposure time.

Whereas the methods according to the first and second aspects of the invention are preferably employed in combination with displacement Talbot lithography, they may alternatively be employed in combination with related, or equivalent, lithographic methods, specifically achromatic Talbot lithography as described in PCT/EP2005/010986 and Solak et al. "Achromatic spatial frequency multiplication: A method for production of nanometer-scale periodic features", J. Vac. Sci. Technol. B23(6), 2005, or that described in International pat. appl. PCT/IB2012/052778.

According to a third aspect of the present invention there is provided an apparatus based on displacement Talbot lithography for forming a desired surface-relief grating of periodic linear features with spatial variation of duty cycle in a layer of photoresist over a substrate, which apparatus comprises:
  a) a first mask bearing a first high-resolution grating of linear features with a period that is twice the period of the desired surface-relief grating;
  b) a means for arranging said first mask parallel to and at a first distance from the substrate;
  c) a second mask bearing a first variable-transmission grating of alternating opaque and transparent linear features that has a period and a designed spatial variation of duty cycle;
  d) a means for arranging said second mask parallel to and at a second distance from the first mask on the opposite side of the first mask to that at a first distance from the substrate, and such that the linear features of the first variable-transmission grating are orthogonal to those of the first high-resolution grating;
  e) a means for generating a beam of monochromatic light for illuminating the second mask such that the light incident on the second mask is well-collimated in the plane of incidence that is parallel to the linear features of the first variable-transmission grating and has a pre-determined distribution of angles of incidence in the plane that is orthogonal to the direction of the linear features of the first variable-transmission grating, so that diffracted beams transmitted by said first variable-transmission grating illuminate the first high-resolution grating; and
  f) a means for illuminating for an exposure time the second mask with said beam while varying the first distance according to displacement Talbot lithography, whereby the light-field transmitted by the first high-resolution grating exposes the photoresist to an energy density distribution for forming said desired surface-relief grating.

According to a fourth aspect of the present invention there is provided an apparatus based on displacement Talbot lithography for forming a desired surface-relief grating of periodic linear features with a spatial variation of duty cycle in a layer of photoresist on a substrate, which apparatus comprises:
  a) a first mask bearing a first high-resolution grating of linear features with a period that is twice the period of the desired surface-relief grating;
  b) a means for arranging said first mask parallel to and at a first distance from the substrate;

c) a second mask bearing a first variable-transmission grating of alternating opaque and transparent linear features that has a period and a designed spatial variation of duty cycle;
d) a means for arranging said second mask parallel to and at a pre-determined second distance from the first mask on the opposite side of the first mask to that at a first distance from the substrate, and such that the linear features of the first variable-transmission grating are orthogonal to those of the first high-resolution grating;
e) a means for generating a beam of monochromatic light for illuminating the second mask such that the beam incident on the second mask is well-collimated in the plane of incidence that is parallel to the linear features of the first variable-transmission grating, so that diffracted beams transmitted by said first variable-transmission grating illuminate the first high-resolution grating;
f) a means for displacing the second mask in relation to the period and direction of the linear features of the first variable-transmission grating while illuminating the second mask such that there is substantially no component of modulation with the period of the first variable-transmission grating in the energy density distribution that exposes the photoresist in the exposure time for forming said desired surface-relief grating; and
g) a means for varying the first distance according to displacement Talbot lithography.

Advantageously the substrate is a glass, preferably one with a high refractive index, and the intermediate layer may be a layer of a metal such as aluminium or chrome which, following the printing of the surface-relief grating, is etched so as to transfer the desired spatial variation of duty cycle into the metal layer, the etched metal layer subsequently being employed as a hard mask to transfer, in another etching process the spatial variation of duty cycle into the underlying substrate.

Alternatively the substrate may be of an opaque material, such as silicon, or non-opaque material, into the which spatial variation of duty cycle printed in the photoresist is subsequently transferred using an etching and/or other process steps; and the resulting spatial variation of duty cycle formed on the surface of the opaque, or non-opaque, material is then employed as a stamp, or for formation of a stamp, in a nanoimprinting process, especially one for manufacturing AR or VR displays.

According to a fifth aspect of the present invention there is provided a method based on displacement Talbot lithography for forming a desired surface-relief grating of periodic linear features with a spatial variation of duty cycle in a layer of photoresist on a substrate, which method comprises:
a) providing a first mask bearing a first high-resolution grating of linear features with a period that is twice the period of the desired surface-relief grating;
b) arranging said first mask parallel to and at a first distance from the substrate;
c) providing a second mask bearing a first variable-transmission grating of alternating opaque and transparent linear features that has a period and a designed spatial variation of duty cycle;
d) generating a beam of monochromatic light for illuminating the second mask so that diffracted beams are transmitted by the first variable-transmission grating;
e) providing an optical arrangement between said second mask and said first mask such that only the $0^{th}$- or a $1^{st}$-order beam of said diffracted beams illuminate the first high-resolution grating in the first mask and such that said $0^{th}$- or $1^{st}$-order beam is well-collimated in the plane of incidence on the second mask that is orthogonal to the linear features of the first high-resolution grating;
f) illuminating for an exposure time the first variable-transmission grating with said illumination beam while varying the first distance according to displacement Talbot lithography, whereby the light-field transmitted by the first high-resolution grating exposes the photoresist to an energy density distribution for forming said desired surface-relief grating;
wherein said spatial variation of duty cycle in the first variable-transmission grating is designed based on a pre-determined dependence of the duty cycle of a surface-relief grating formed using displacement Talbot lithography on the energy density of the beam that illuminates the first mask in the absence of the second mask and according to the spatial variation of duty cycle of the desired surface-relief grating.

Preferably the local period of the linear features in the first linear variable transmission grating is constant over the area of the grating though alternatively it may vary.

Preferably, the optical arrangement comprises a sufficiently large distance between said second and first masks such that only respectively the $0^{th}$ or a $1^{st}$ diffraction order illuminates the high-resolution grating in the first mask. Alternatively, the optical arrangement comprises a 4f imaging system and spatial filter that images respectively the $0^{th}$ or a $1^{st}$ diffraction order transmitted by the variable-transmission grating onto the high-resolution grating in the first mask and a spatial filter that blocks the other diffraction orders.

BRIEF DESCRIPTION OF THE FIGURES

These and other aspects of the present invention will now be further described, by way of example only, with reference to the accompanying figures in which.

DETAILED DESCRIPTION OF THE INVENTION

Figure 2:
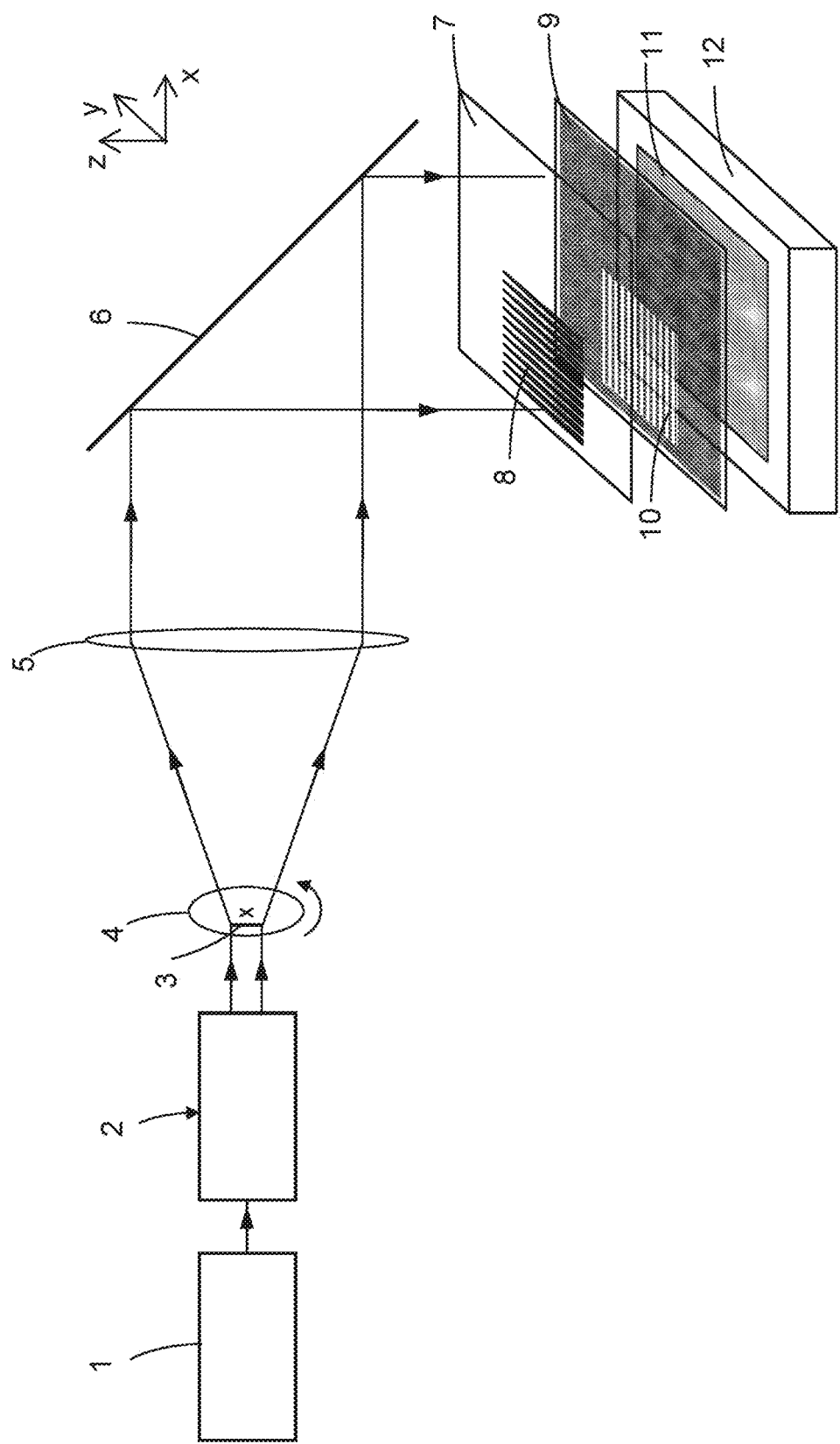
FIG. 2 schematically illustrates a first embodiment of the invention.
Figure 3:
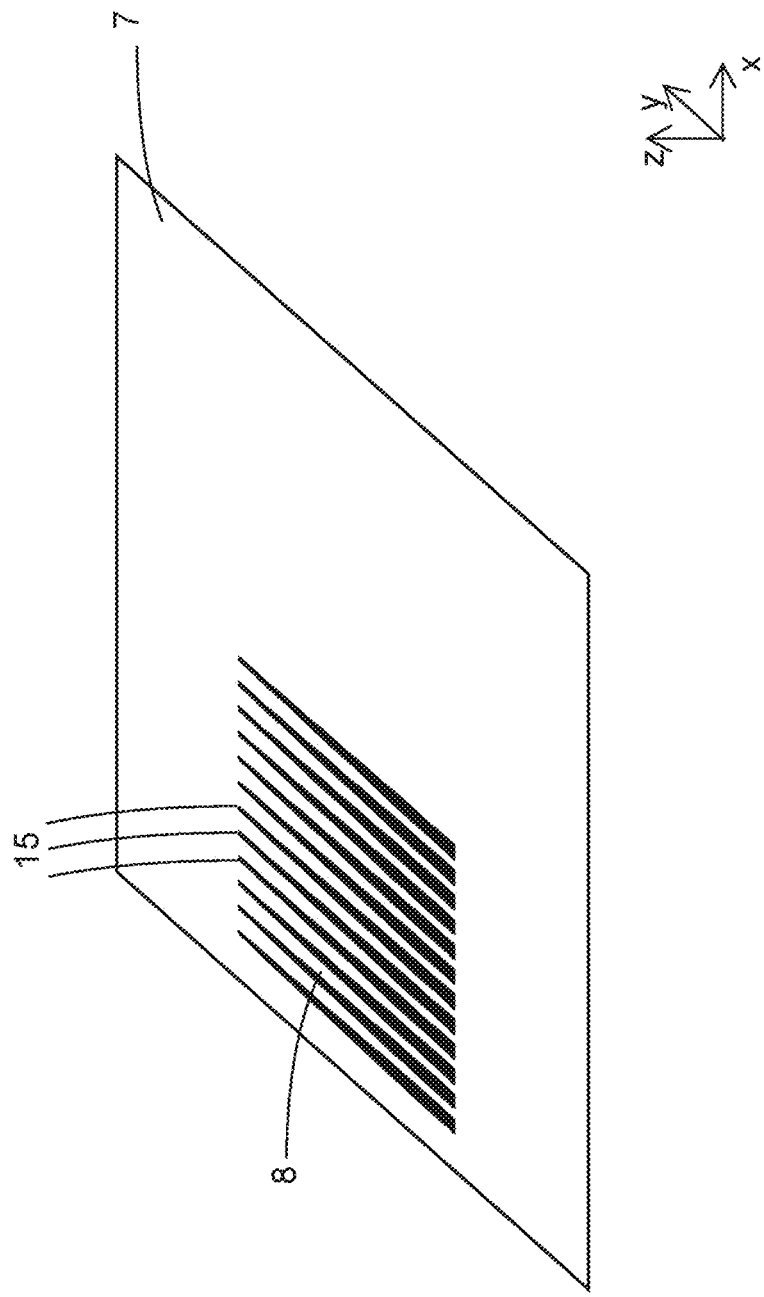
FIG. 3 schematically illustrates the design of the variable-transmission grating employed in the first embodiment

With reference to FIG. 2, which shows schematically a first exemplary embodiment of the invention, an ArF excimer laser 1 emits a collimated beam of pulsed light at a wavelength of 193 nm and with FWHM dimensions ~3 mm×6 mm (z x y). The intensity profile of the beam is approximately Gaussian in the vertical, short-axis direction, and approximately top-hat in the horizontal, long-axis direction. A laser with such properties can be obtained from, for example, Coherent Inc., Santa Clara, U.S.A. The beam is incident on a beam transformer 2 that comprises a first pair of cylindrical lenses for expanding the beam in the vertical direction and a second pair of cylindrical lenses for compressing the beam in the horizontal direction, such that the FWHM dimensions of the elongated beam of collimated light 3 are ~7 mm×2 mm (z x y). The output beam of the transformer 3 is incident on a diffractive diffuser 4 that is mounted to a rotation stage (not shown) for rotating the diffuser 4 about a central, orthogonal axis that is offset from the illumination axis of the elongated beam. The diffuser 4 diffracts the light to produce a substantially homogenous distribution over a narrow range of angles with a half-cone angle of ~2.5° with respect to the optical axis, and the rotation further improves the degree of homogenization. Such diffractive homogenizing diffusers are available from the companies HoloOr Ltd, Ness Ziona, Israel, and Jenoptik GmbH, Jena, Germany. The light scattered by the diffuser is collimated by a lens 5 with focal length ~2.4 m to produce a beam of uniform intensity and diameter ~200 mm. Whereas the drawing shows the lens 5 to be a single biconvex element, it should be understood that this is only a schematic representation and that the lens may have another shape and/or consist of more than a single lens element. The function of the lens 5 is to produce a well-collimated beam of light with the diameter required that, in the absence of the variable-transmission mask 7, would produce a uniform illumination of the fine-grating mask 9, the design of which could be readily determined by a person skilled in standard optical design of lens systems. The collimated beam from the lens 5 is then reflected by a mirror 6 so that it illuminates a variable-transmission mask 7 at normal incidence. The mask 7 is mounted on a mask chuck (not shown in the figure) that has a central aperture to allow passage of the beam transmitted by the mask 7. With reference to FIG. 3, which schematically shows a magnified view of the variable-transmission mask 7, the variable-transmission grating 8 has dimensions ~50 mm×50 mm and is composed of periodic alternating chrome lines 15 and spaces with a period 100 µm on the surface of a transparent fused silica substrate. The grating 8 has been formed using standard electron-beam or laser-beam mask writing techniques. Whereas the period of the lines of the variable-transmission grating 8 is constant over its area, the ratio of the width of the chrome lines 15 to the grating period, i.e. the duty cycle, varies in an approximately continuous though non-linear fashion between the values of ~0.2 and 0.8 in a direction parallel to the lines and is constant in the orthogonal direction. The linewidth of the substantially parallel chrome lines 15 therefore varies from 20 to ~80 µm along the 50 mm-50 mm length of the lines 15. The mask 7 is oriented so that the grating lines 15 are parallel to the y axis. Moreover, the rate of variation of the duty cycle is not constant but varies along the lines 15. An approximately continuous, or smooth, variation of duty cycle may be realized by, preferably, defining the grating lines 15 as a sequence of trapezoids each with its 2 parallel edges parallel to the x axis and its 2 inclined sides tilted by the appropriate angle for producing the local rate of change of linewidth required in the y direction. The smaller the separation selected between the 2 parallel edges of each trapezoid the more closely the sequence of trapezoids approximates to a smooth, continuous variation of linewidth.

A similar variable-transmission mask composed of a periodic pattern of alternating opaque lines and spaces with a spatially varying duty cycle has been proposed in combination with another DTL-related exposure scheme and other optical arrangement for another purpose, specifically for enabling a seamless stitching together of high-resolution gratings patterns for manufacturing large-area polarizers. The details of the scheme proposed are described in unpublished U.S. provisional pat. appl. No. 62/659,731, entitled "Methods and systems for printing large periodic patterns by overlapping exposure fields", which is included in its entirety by way of reference in the present application.

The grating pattern 8 in the variable-transmission mask 7 diffracts the transmitted light in the xz plane to produce a $0^{th}$ and higher diffraction orders that propagate towards a fine-grating mask 9 located at a distance of ~50 mm below the variable-transmission mask 7. Because the diffraction orders spatially separate in the xz plane as they propagate towards the fine-grating mask 9, it is advantageous that the width of the variable-transmission grating 8 in the x direction is designed sufficiently larger than the corresponding width of the fine grating 10 so that the entire fine-grating pattern 10, including its left and right edges, is illuminated by all the diffraction orders of significant relative intensity transmitted by the variable-transmission mask 7 (preferably all those with diffraction efficiency >0.5%). The fine-grating mask 9 bears a π-phase-shift grating 10 with dimensions 50 mm×50 mm and a uniform period of 600 nm. The phase-shift grating 10 was produced using standard techniques, by first fabricating an amplitude grating in a chrome mask using e-beam lithography, then RIE etching of the fused silica substrate material to the required depth between the chrome lines, and finally removing the chrome lines by etching. The mask 9 is oriented so that the lines of the fine-grating pattern 10 are parallel to the x axis, and so orthogonal to the lines of the grating 15 in the variable-transmission mask 7. Unlike the grating 8 in the variable-transmission mask 7, the duty cycle of the grating 10 in the fine-grating mask 9 is uniform and ~0.5. The light-field transmitted by the fine-grating pattern 10 is incident on a photoresist-coated glass wafer 11 located on a vacuum chuck 12 that is mounted onto z-direction displacement stage of a DTL-exposure system (not shown in the figure).

The orientation of the grating lines 15 in the variable-transmission mask 7 are arranged orthogonal to those in the fine-grating mask in order that the angular divergence in the xz plane of the orders diffracted by the variable-transmission mask 7 does not degrade the resolution of the grating pattern printed into the photoresist layer 11. As taught in the prior art on displacement Talbot lithography (see, for example, U.S. Pat. No. 12,831,337), the beam illuminating each point of a linear grating in the mask needs to be well collimated in the plane orthogonal to the direction of the grating lines, otherwise the lines of the printed grating will be smeared out and the resolution lost. The resolution of the printed pattern is not, however, degraded if the light in the illuminating beam has a range of angles on incidence in the plane that is parallel to the grating lines. The rectilinearity of the features in the variable-transmission mask 7 and their orthogonality with respect to the lines of the corresponding grating 10 in the fine-grating mask 9 are therefore important features of the present invention.

The spatial variation of duty cycle, f(x, y), over the grating 8 in the variable-transmission mask 7 is designed to produce a required spatial variation of intensity, I(x, y), in the beam illuminating the fine-grating mask 9. The spatial variation of transmission, T(x, y), across the grating 8, where the transmission is defined as the mean value over one period of the pattern, is approximately given by $$T(x, y) = 1 - f(x, y)$$

So, if the duty cycle is 1, i.e. the width of the chrome line 15 is equal to the grating period, then the local transmission of the variable-transmission mask 8 is 0; and conversely, if the duty cycle is =0, i.e. the width of the chrome lines 15 is 0, then the local transmission of the variable-transmission mask 7 is 1. By arranging the system parameters so that the light in all diffracted orders from a particular (x, y) coordinate in the variable-transmission mask 7 illuminate substantially the same coordinate in the fine-grating mask 9, the spatial variation of intensity at the fine grating mask 9, averaged over one period of the variable-transmission grating in the y direction, is given by:

$$I(x, y) = I_0\{1 - f(x, y)\}$$

where $I_0$ is the intensity of the beam illuminating the variable-transmission mask 7.

It is advantageous that the spatial separation of the diffracted orders illuminating the fine-grating mask 9 is arranged to be much smaller than the dimension of the fine grating 10 in the x-direction. Firstly, it enables a higher resolution of spatial intensity variation in the beam illuminating the fine-grating mask 10 (i.e. the intensity variation can have higher spatial frequency components), and secondly it reduces the additional width required, in the x direction, of the variable-transmission grating 8 relative to the fine grating 10 in order for the edges of the fine-grating pattern 10 to be also illuminated by all the diffraction orders from the variable-transmission mask 7 that have significant relative intensity. Minimization of this additional width is important if other gratings with different periods and/or orientations of grating lines are included in the fine-grating and variable-transmission masks 7, 9 because it permits smaller separations between the different gratings in each mask.

The spatial separation, ±Δs, of the diffracted orders illuminating the fine-grating pattern is given by:

$$\Delta s \approx \frac{2L\lambda}{(1-\alpha)\Lambda_2}$$

where L is the separation between the variable-transmission and fine-grating masks 7,9, λ is the illumination wavelength, α is largest duty cycle in the variable-transmission grating 8 and $\Lambda_2$ is the period of the grating.

Evaluating this with L=50 mm, λ=193 nm, α=0.8 and $\Lambda_2$=100 μm yields Δs≈±1 mm, which is small in relation to the dimension of the fine-grating pattern 10 in the x direction.

With an ideally collimated beam illuminating the variable-transmission mask 7, the diffracted beams transmitted by the mask 7 would interfere at the plane of the fine-grating mask 9 to produce a strong component of intensity modulation in the x direction that has the period (or fractional period) of the variable-transmission grating 8, which would be unacceptable in the desired printed pattern. To eliminate this undesired non-uniformity, it is arranged that the angular distribution of the light illuminating each point of the variable-transmission mask 7 has an approximately Gaussian profile and a minimum angular bandwidth. By so doing, the spatial intensity distributions cast by neighboring lines of the variable-transmission grating 8 onto the fine-grating mask 9 overlap to a sufficient extent that the integrated intensity distribution in the x direction has good uniformity. For this reason, It is arranged that the full-width half-maximum (FWHM) value of the Gaussian angular distribution $\phi_x$, illuminating the variable-transmission mask 7 in the xz plane is given by $$\phi_x \geq \frac{1.5\Lambda_2}{L}$$

where $\Lambda_2$ is the period of the variable-transmission grating 8 and L is the separation between the variable-transmission and fine-grating masks 7,9.

Thus, evaluating with the parameters selected in this embodiment, i.e. $\Lambda_2$=100 μm and L=50 mm, yields $\phi_x$≥3 mR. Higher uniformity may be achieved using a larger angular bandwidth and/or by adjusting the separation of the variable-transmission and fine-grating masks 7,9 so that a fractional Talbot image of the variable-transmission grating 8 is formed on the fine-grating mask (the spatial intensity distribution of a fractional Talbot image has a period that is a fraction of that of the variable-transmission grating, e.g. ½, ⅓ or ¼).

This angular distribution is formed by the intensity distribution illuminating the diffuser 4, which is ~Gaussian profile in the z direction, and the focal length of the collimating lens 5. The resulting FWHM of the Gaussian angular distribution illuminating the variable-transmission mask 7 is calculated from $$\phi_x = \frac{w_z}{F}$$

where $w_z$ is the FWHM length, in the z direction, of the elongated beam illuminating the diffuser 4 and F is the focal length of the collimating lens 5.

Evaluating $\phi_x$ with the parameter values employed in this embodiment, i.e. $w_z$=7 mm and F=2.4 m, yields $\phi_x$=3 mR, so is sufficient for satisfying the above requirement for eliminating the component of intensity modulation corresponding to the periodicity of the variable-transmission grating 8 from the light-field incident on the fine-grating mask 9.

As mentioned above, the angular divergence, in the yz plane, of the beam illuminating each point of the fine-grating mask 9 is important for ensuring a good resolution of the grating lines of the DTL printed pattern. The angular divergence in the yz plane produced by the illumination system of this embodiment is given by $$\phi_y = \frac{w_y}{F}$$

where $w_y$ is the FWHM width, in the y direction, of the elongated beam illuminating the diffuser and F is the focal length of the collimating lens 5.

Evaluating $\phi_y$ with the parameter values employed in this embodiment, i.e. $w_y$=2 mm and F=2.4 m, yields $\phi_y$≈0.8 mR, which is sufficiently small for printing well-resolved lines in a grating of period 300 nm (half that of the period of the grating 10 in the fine-grating mask 9) using displacement Talbot lithography with a separation of ~50 μm between the fine-grating mask 9 and photoresist-coated wafer 11.

Figure 4:
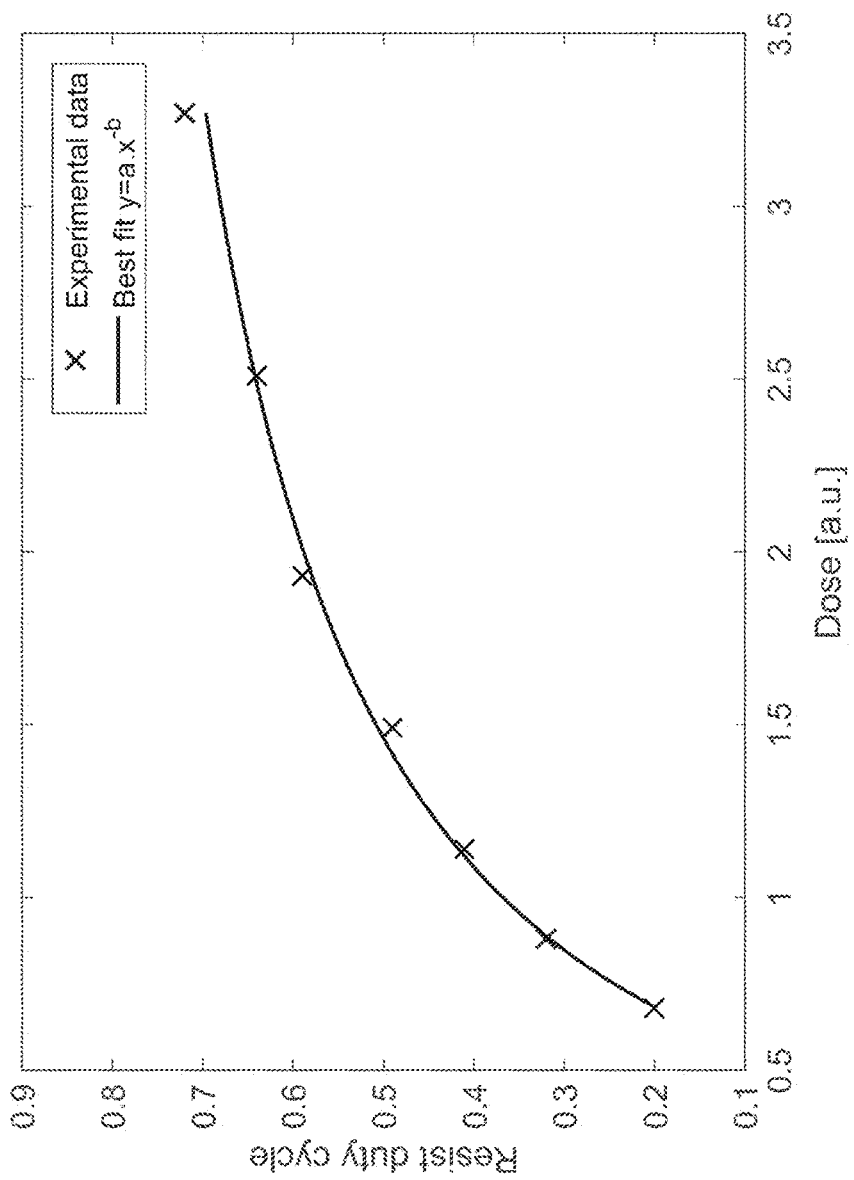
FIG. 4 is shows a set of characterisation data plotting the dependence of linewidth against exposure dose

The spatial variation of exposure dose required over the fine-grating mask 9 for forming a particular desired spatial variation of duty cycle in the surface-relief grating depends on the properties of the photoresist, the thickness of the photoresist layer needed for the particular application, the substrate and/or intermediate layer(s) of other material(s) below the photoresist, and the photoresist development process. The characterization of the photoresist response is best determined empirically by performing a number of DTL exposures of the fine-grating concerned using a large range of exposure doses and without the variable-transmission mask in the system (so according to standard DTL exposure); and then measuring the linewidths of the resulting surface-relief gratings formed in the photoresist after layer development. The measurements are preferably made with a scanning electron microscope (SEM). A typical set of characterization results, obtained by printing a 300 nm-period grating from the 600 nm-period phase grating into a layer of a standard, commercially available negative-tone photoresist, is shown in FIG. 4. The figure plots the duty cycles calculated from each linewidth measurement for different exposure doses, and includes a best-fit curve for enabling the dose needed for any value of duty cycle to be readily determined. The best fit curve is described by $$DC = 2.63 E^{-0.62}$$

where DC is the duty cycle and E is the exposure dose in arbitrary units

As can be seen from the figure, the range of exposure doses employed enables the duty cycle of the printed pattern to be varied over a large range from ~0.2 to 0.7. Whereas the equation of the best-fit curve above contains just a single term, with other photoresists and other photoresist processes, the best-fit curve may be described by more than one term.

Figure 5:
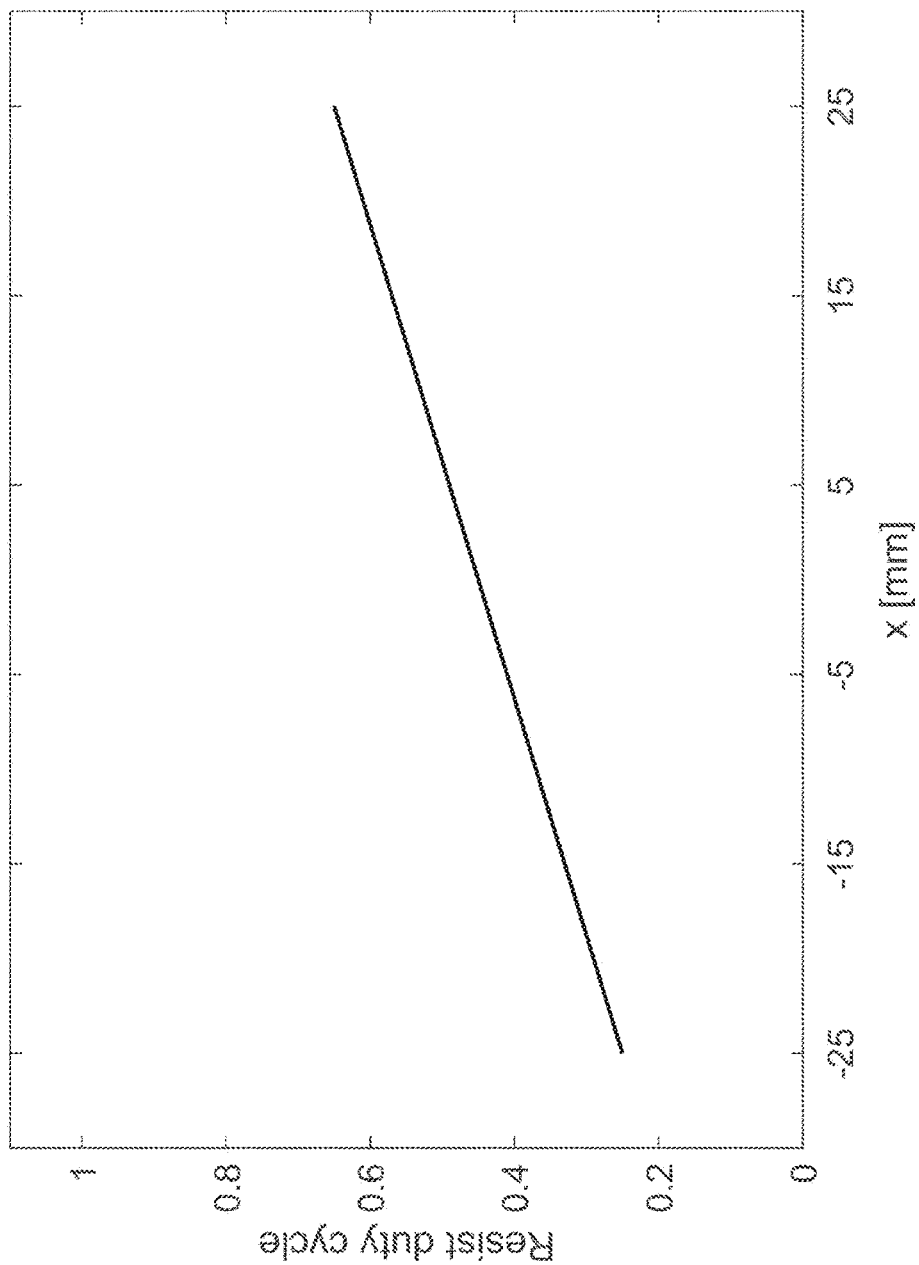
FIG. 5 shows an exemplary linear variation of duty cycle desired in a surface-relief grating printed in the first embodiment.
Figure 6:
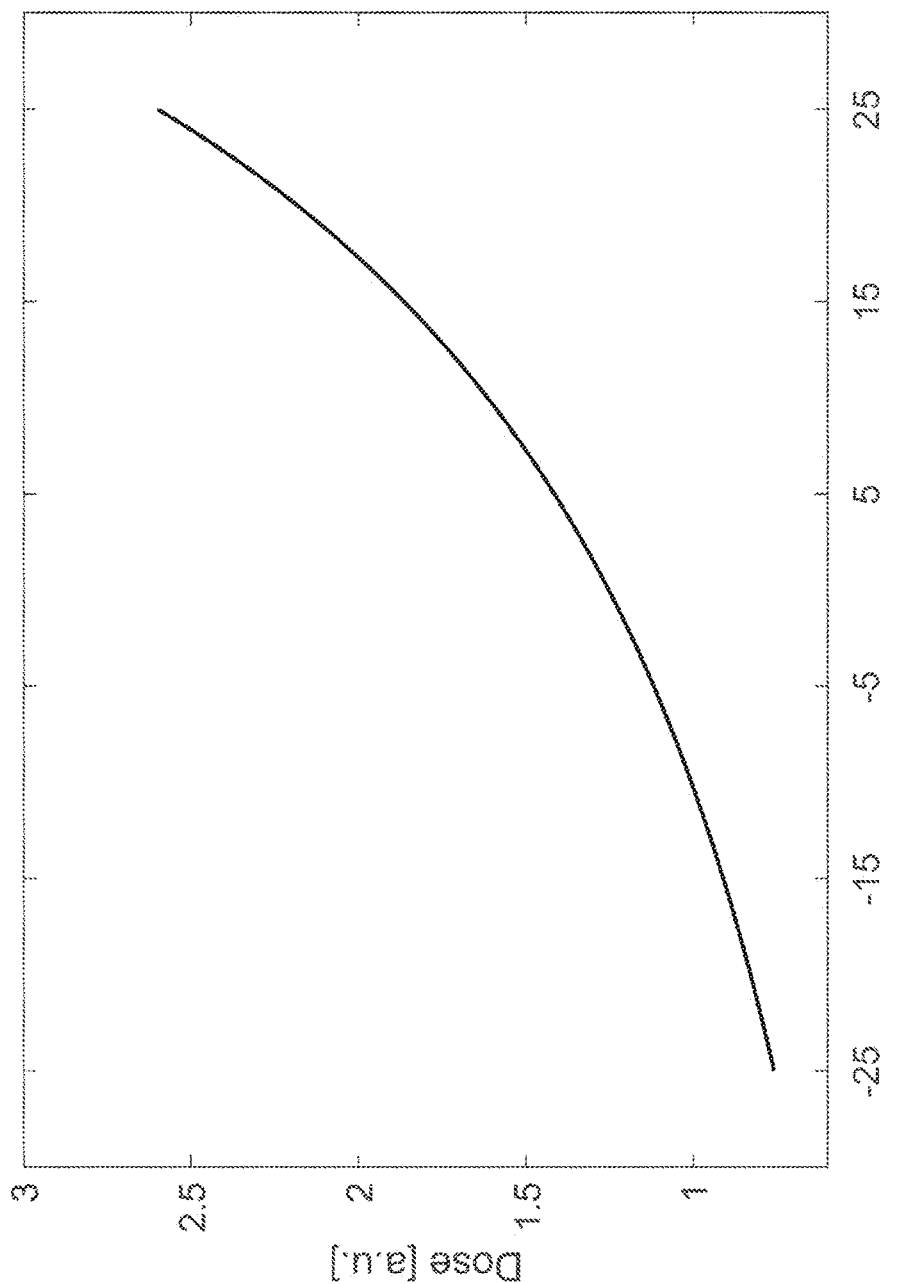
FIG. 6 shows the variation of exposure dose required across the fine-grating mask to produce the variation of duty cycle plotted in FIG. 5.

To print, for example, a 50 mm-long 300 nm-period surface-relief grating with the linear variation of duty cycle shown in FIG. 5, the variation of exposure dose needed across the 600 nm-period grating in the fine-grating mask can be simply calculated from the equation of the best-fit curve. The result is shown in FIG. 6. Finally, the duty cycle variation, f(x,y), required in the variable-transmission mask for generating the dose variation, E(x,y), at the fine-grating mask is calculated using $$f(x, y) = 1 - \frac{E(x, y)}{E_0}.$$

where $E_0$ is a constant that is selected so that duty cycle varies between desired range.

Preferably, $E_0$ is set to be the sum of the maximum and minimum dose values, so that the deviation of variation of duty cycle from 0.5 is minimized.

Figure 7:
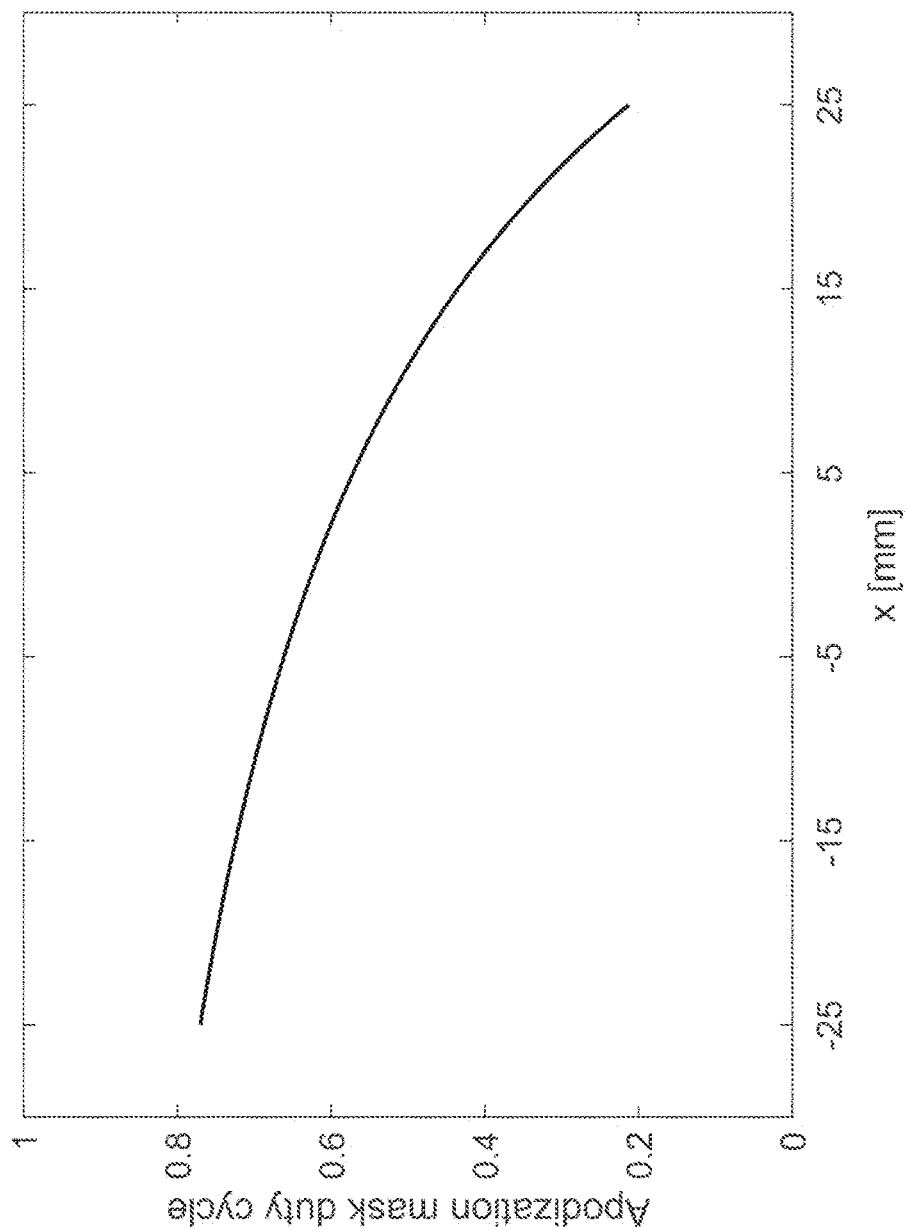
FIG. 7 shows the variation of duty cycle across the variable-transmission mask required to produce the exposure dose variation plotted in FIG. 6.

With $E_0$ thus selected the spatial variation of duty cycle required in the y direction across the variable-transmission mask is illustrated in FIG. 7. The largest rate of change of duty cycle over the mask, which occurs at x=25 mm, is ~0.03/mm; so the largest tilt angle required between the two sides of each 100 μm-period line of the variable-transmission grating is ~3 mR.

Figure 8:
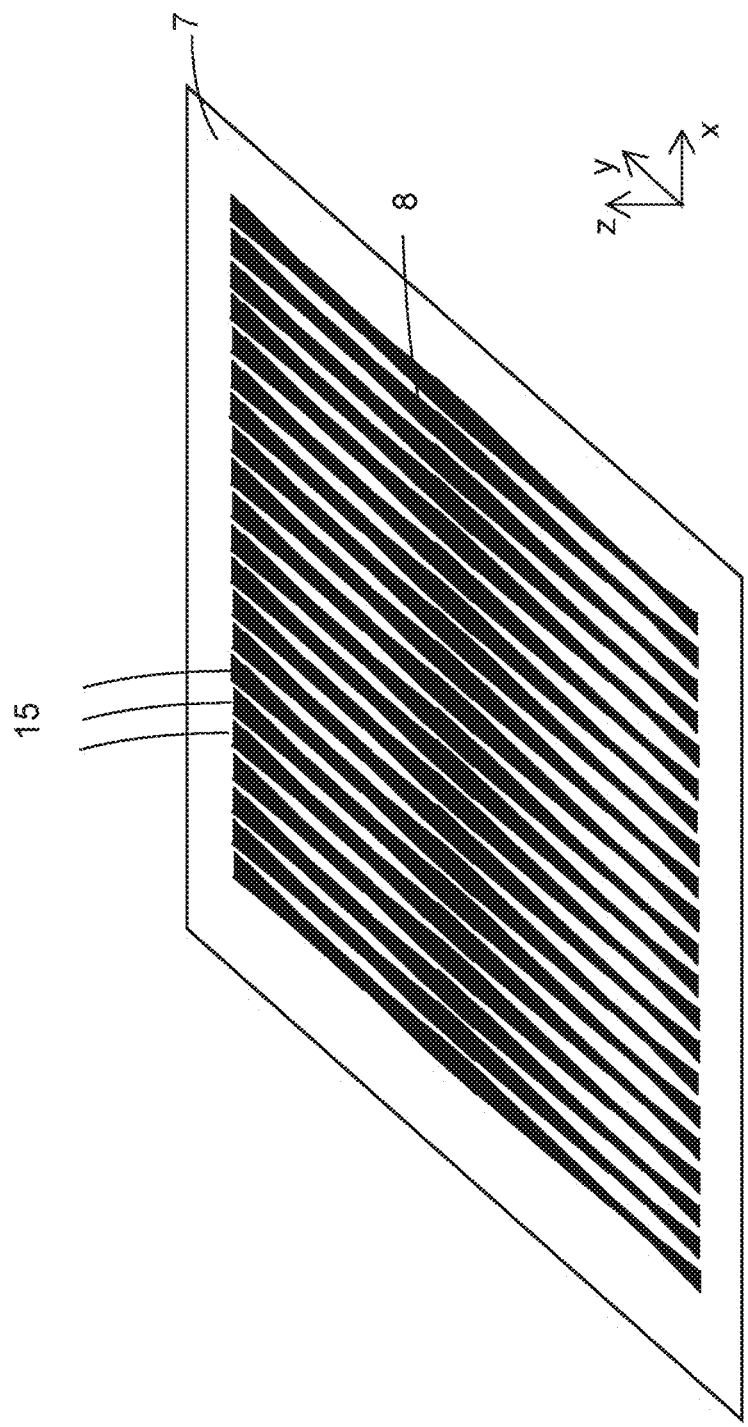
FIG. 8 schematically illustrates a non-linear variation of duty cycle across a variable-transmission mask in a direction parallel to the lines of the mask.
Figure 9:
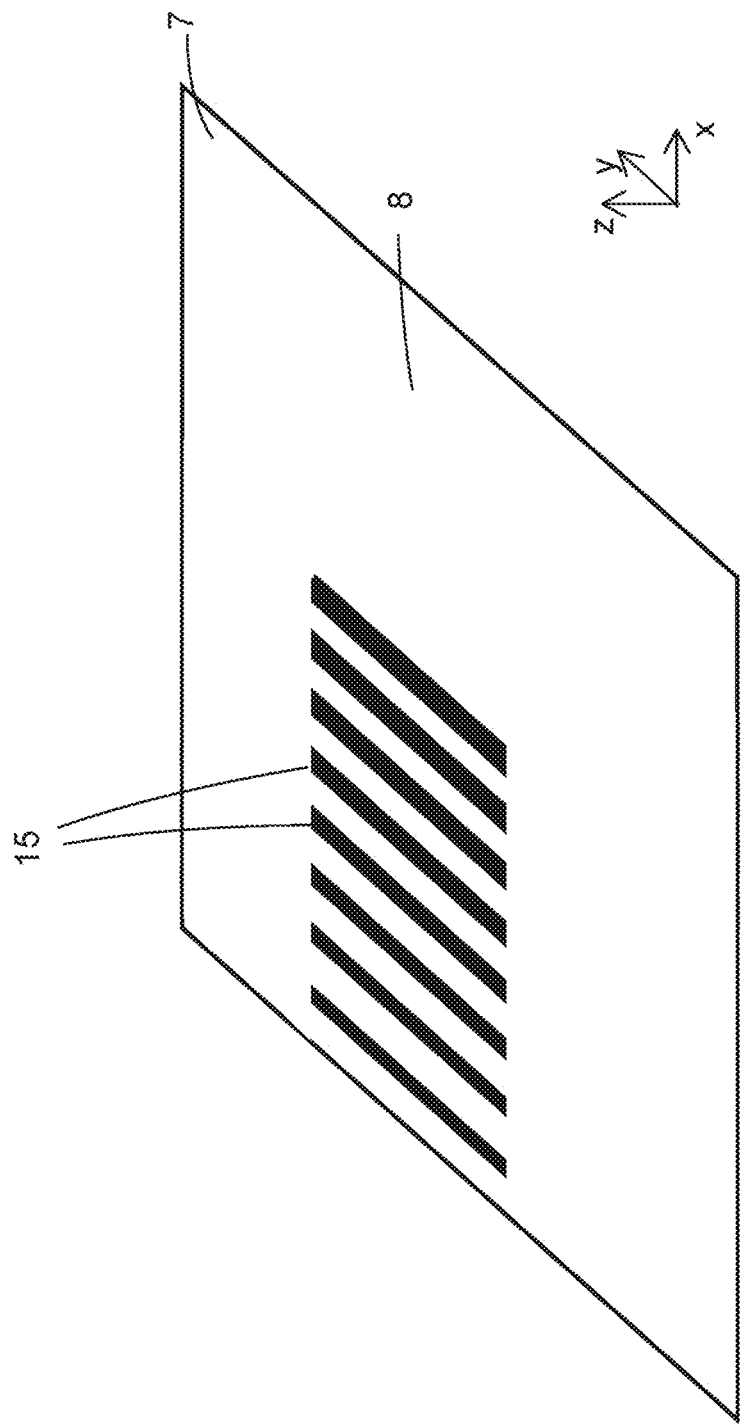
FIG. 9 schematically illustrates a variation of duty cycle across a variable-transmission mask in directions orthogonal and parallel to the lines of the mask.
Figure 10:
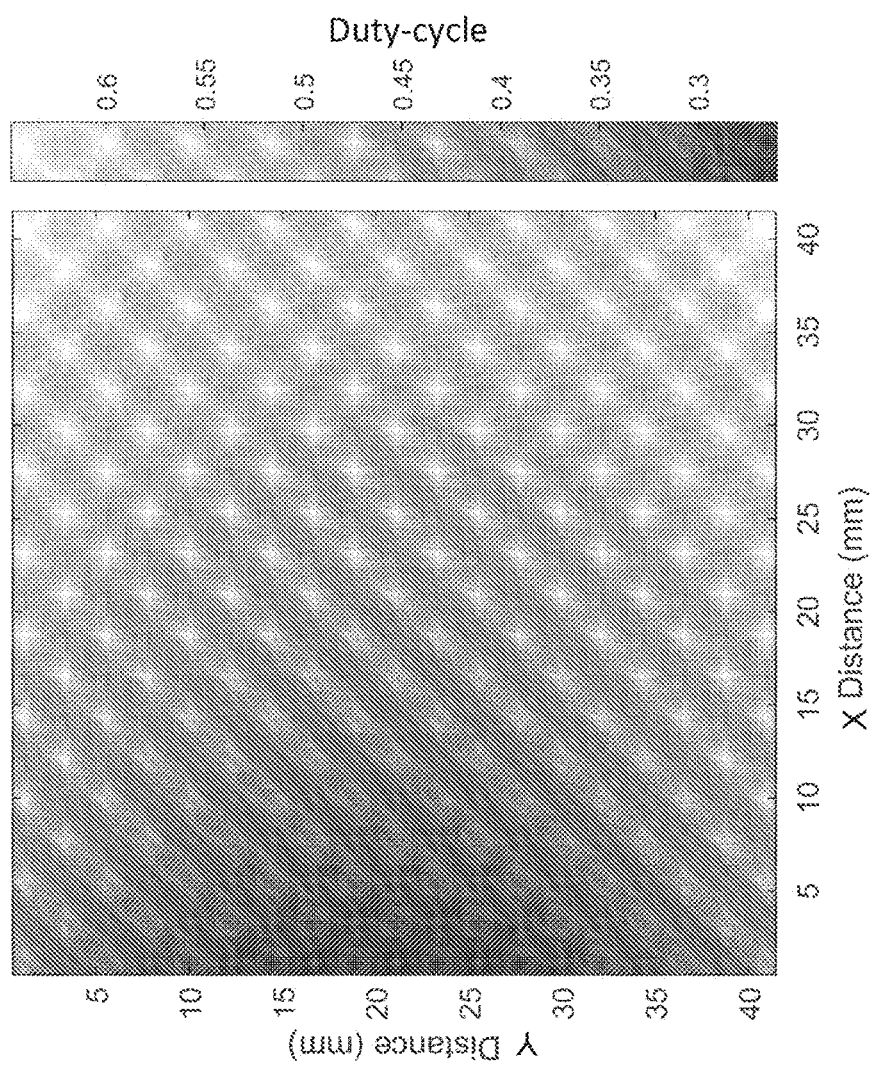
FIG. 10 schematically illustrates a variation of duty cycle across a variable-transmission mask in a direction orthogonal to the lines of the mask.

Whereas this first embodiment describes the application of the invention to the fabrication of a surface-relief grating in photoresist whose duty cycle varies across the grating with a certain linear variation in a direction that is orthogonal to the grating lines, in other variants of this (and later) embodiments, the desired duty cycle variation in the surface-relief grating may be, for example, in the same direction orthogonal to the lines but instead a non-monotonic variation, in which case the variation of duty cycle required across the variable-transmission mask may be as illustrated in FIG. 8. Alternatively, duty cycle variation desired in the surface-relief grating may be in a direction parallel to the grating lines in which case the duty cycle variation in the variable-transmission mask would be as schematically shown in FIG. 9. Yet alternatively, the duty cycle variation desire in the surface-relief grating may be a two-dimensional variation, in which case the duty cycle variation designed in the variable-transmission mask could be as schematically illustrated in FIG. 10, in which the duty cycle required at each (x, y) coordinate is color coded.

Further whereas this first embodiment describes that a single large surface-relief grating with dimensions 50 mm×50 mm is printed onto the photoresist coated wafer, in other embodiments a plurality of gratings of the same of different size could be instead printed in a single exposure using the same large exposure beam and suitably designed variable-transmission and fine-grating masks each with a plurality of the respectively variable-transmission and fine-grating patterns appropriately arranged across their areas. In fact, using the homogenization method of the first embodiment, i.e. a rotating diffractive diffuser, it is preferable that no pattern is positioned at the center of each mask because an imperfectly fabricated diffractive diffuser can generate an un-diffracted "0th order" component of light that is subsequently focused by the collimating lens 5 to a small, high-intensity spot at the center of the fine-grating mask. In other embodiments, alternative means of beam homogenization could be used to overcome this imperfection, such as refractive beam homogenizers, as for instance are commonly employed for beam expansion and homogenization on conventional photolithographic equipment.

In a related embodiment, following the exposure of a smaller grating pattern onto a photoresist coated wafer 11 according to the first embodiment, the wafer 11 is rotated on the chuck 12 about the z axis by an angle and a second exposure is then performed using the same or different variable-transmission and fine-grating masks 7,9 to print a second grating whose lines are not parallel to those of the grating printed in first exposure. In this embodiment it is however important that the lines of the second variable-transmission and fine-grating masks are again orientated parallel to respectively y and x axes so as to benefit from the asymmetric angular distribution of the illumination beam. In more elaborate versions of embodiments employing sequential exposures with the same or different line orientations in the sequentially printed patterns, an alignment system composed of, for example, alignment microscopes, for viewing alignment marks included alongside the fine-grating pattern may be additionally employed to obtain a high positional accuracy between the sequentially printed patterns. In this case the wafer (or fine-grating mask) should be mounted to an x, y, θ positioning system similar to that employed on standard mask aligner photolithographic equipment.

Figure 11:
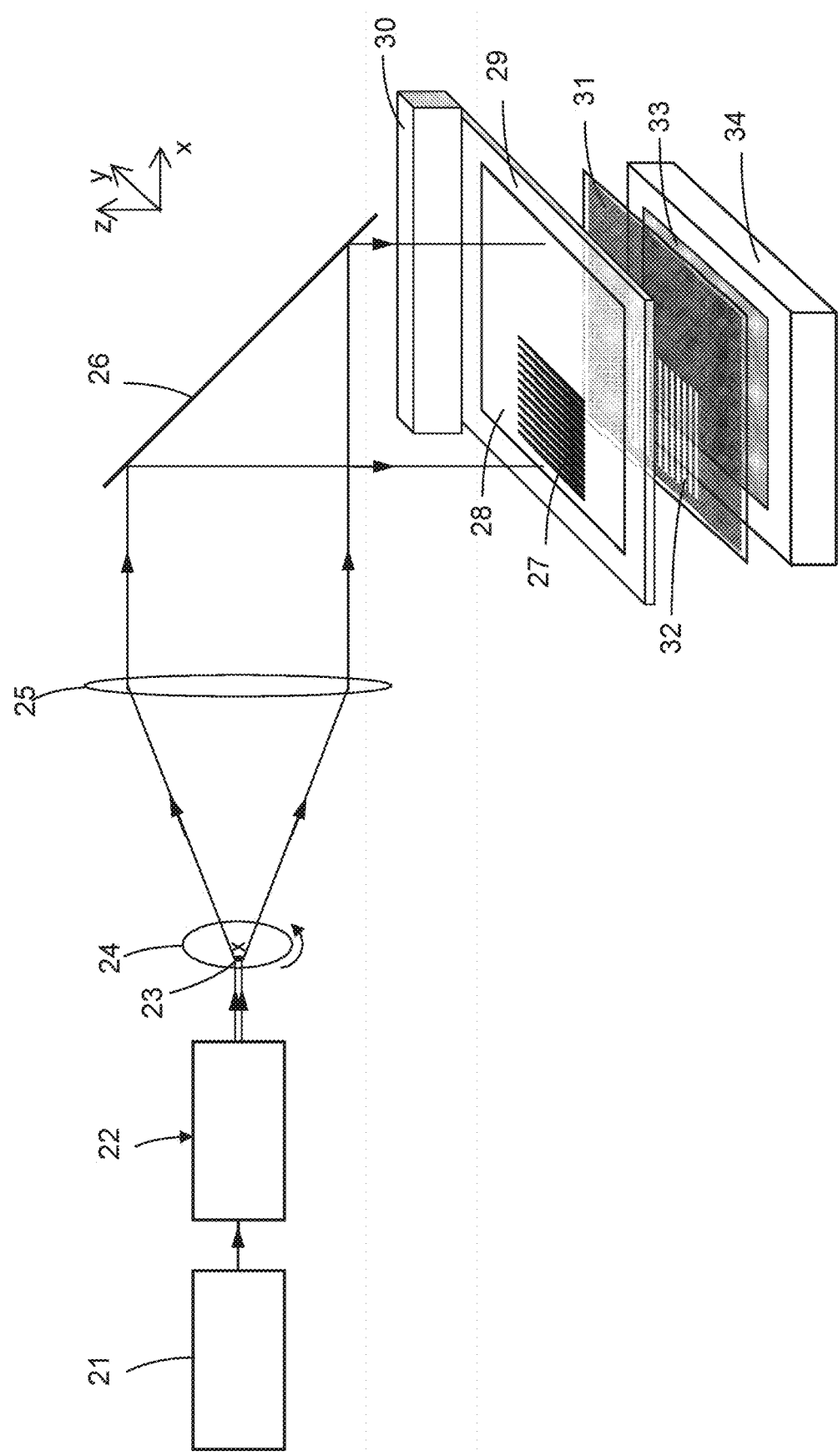
FIG. 11 schematically illustrates a second embodiment of the invention.

With reference to FIG. 11, which shows schematically a second exemplary embodiment of the invention, an ArF excimer laser 21 emits a beam of pulsed light with the same characteristics as in the first embodiment. The beam is incident on a beam transformer 22 that comprises a first pair of cylindrical lenses for compressing the beam in the vertical direction and a second pair of cylindrical lenses for compressing the beam in the horizontal direction, such that the FWHM dimensions of the ~square beam of collimated light 23 are ~2 mm×2 mm (z × y). The output beam of the transformer 23 is incident on a diffuser 24 that is mounted to a motorised stage (not shown) for rotating the diffuser 24 about a central, orthogonal axis that is offset from the optical axis of the illuminating beam. The diffuser 4 scatters the light homogenously over a narrow range of angles with a half-cone angle of ~2.5° with respect to the optical axis. The light scattered by the diffuser 24 is collimated by a lens 25 of focal length ~2.4 m to produce a beam of uniform intensity and diameter ~200 mm. The collimated beam from the lens 25 is then reflected by a mirror 26 so that it illuminates at normal incidence a pattern in an variable-transmission mask 27 mounted on a mask chuck 29 with a central aperture to allow passage of the light transmitted by the mask 27. The mask chuck 29 is mounted to a translation stage 30 that has fine-positioning actuators that allow the mask 27 to be translated with micron accuracy and variable speed in the x direction and over a travel range of more than 1 mm. The variable-transmission mask 28 bears the same pattern 27 as employed in the first embodiment, namely a grating with dimensions ~50 mm×50 mm, a period of 100 μm, and a duty cycle that varies in a direction parallel to the grating lines. The variable-transmission grating 27 diffracts the transmitted light in the xz plane to produce a $0^{th}$ and higher diffraction orders that propagate towards the same fine-grating mask 31 as employed in the first embodiment, which is again located at a distance of ~25 mm below the variable-transmission mask 28. Because the diffraction orders spatially separate in the xz plane as they propagate towards the fine-grating mask 31, it is advantageous that the width of the variable-transmission grating 27 in the x direction is designed sufficiently larger than the corresponding width of the fine grating 32 so that the entire fine-grating pattern 32, including its left and right edges, is illuminated by all the diffraction orders from the variable-transmission mask 28. The fine-grating mask 31 bears the same 7-phase-shift grating as used in the first embodiment: it has dimensions 50 mm×50 mm, a uniform period of 600 nm, a uniform duty cycle of ~0.5 and its lines are oriented parallel to the x axis. The light-field transmitted by the fine-grating pattern 32 is incident on a photoresist-coated glass wafer 33 located on a vacuum chuck 34 that is mounted onto z-direction displacement stage of a DTL-exposure system (not shown in the figure).

Unlike in the first embodiment, the beam illuminating the variable-transmission mask 28 is well collimated (<1 mR) in both xz and yz planes because of the size and shape of the beam 23 illuminating the diffuser 24. As a result, the diffracted beams transmitted by the variable-transmission mask 28 interfere at the plane of the fine-grating mask 31 to produce a strong component of intensity modulation in the x direction that has a period (or fractional period) of the variable-transmission grating 27, which would be unacceptable in the desired printed pattern.

To eliminate this undesired component of non-uniformity, the variable-transmission mask 28 is displaced in the x-direction during the DTL exposure. It can be achieved by displacing the mask 28 in the x direction by exactly 1 period of the variable-transmission grating 27, or alternatively by an integral number of periods, and with a constant speed of displacement during the exposure such that the maximum displacement is reached at the end of the exposure. It may alternatively be achieved by displacing, or scanning, the variable-transmission mask 28 back and forth in the y direction a number of times by a scan distance of one period, or an integral number of periods, and using a constant speed in each scan such that the exposure finishes at the end of the final scan. Such constant-speed displacement or scanning schemes, however, require that the variable-transmission mask 28 is displaced over an exact distance of one or an integral number of periods of the variable-transmission grating 27 otherwise an unacceptable y-direction modulation of the intensity distribution illuminating the fine grating 32 can result.

It is therefore advantageous that a variable speed displacement or scanning scheme be used, in particular one which generates a dependence of incremental exposure dose on y-position of the variable-transmission mask 28 that has a Gaussian, or near-Gaussian, profile with a full-width at half-maximum (FWHM) distance that is sufficiently large with respect to the period of the variable-transmission grating 27. For a set of regularly-spaced, overlapping Gaussian intensity profiles, it can be readily mathematically shown that integrated intensity is uniform to ~1% if the FWHM width of the Gaussian profile is ~1.5× greater than the spacing distance between the overlapping profiles. Based on this it is therefore preferable that the FWHM distance, S, of the Gaussian profile describing the dependence of exposure dose on the y-position of the variable-transmission grating 27 is preferably given by $$S \geq 1.5\Lambda_2$$

where $\Lambda_2$ is the period of the variable-transmission grating.

So, if $\Lambda_2=100$ μm, then S is preferably ≥150 μm. Larger values will produce a better uniformity but would correspondingly reduce the maximum gradient of duty cycle variation obtainable in the surface-relief grating.

It is further preferable that the total width of the Gaussian profile, i.e. the maximum displacement distance, T, corresponds to at least twice the FWHM distance of the Gaussian profile, i.e. T≥2 S, and most preferably corresponds to at least 2.5 S, in order that truncation of the Gaussian profile does not introduce unacceptable non-uniformity into the time-integrated exposure dose in the y direction illuminating the fine-grating mask 32. A larger maximum displacement would produce better uniformity of exposure dose but would also reduce the maximum gradient of the duty cycle variation obtainable in the surface-relief grating.

The minimum values of S and T recommended above for suppressing the component of dose modulation introduced by the periodic nature of the (binary) variable-transmission grating 27 are suitable for any arbitrarily arranged value of separation between the variable-transmission mask 28 and the fine-grating mask 31. If, however, the separation between the two masks 28,31 is arranged so that a fractional Talbot image of the variable-transmission grating 27 (whose period is a certain fraction of the period of the variable-transmission grating), then the minimum values of S and T that may be alternatively used for suppressing the undesired dose modulation are the above-recommended values multiplied by the certain fraction.

It is not essential that the variable-transmission mask 28 is displaced in the x direction during the exposure. It may be alternatively displaced at an angle, θ, with respect to the x axis (using a differently configured translation stage 30). In this case, it is important that the components of displacement in the x-direction corresponding to the FWHM Gaussian width of the dose distribution and to the total distance of displacement respect the above-calculated requirements on S and T.

To realize the above-described Gaussian variation of incremental exposure dose with position of the variable-transmission mask 28, the mask 28 is displaced in the x-direction with a varying speed of displacement by the motorized translation stage 30. To achieve the Gaussian exposure profile, the speed is programmed to vary according to an inverse Gaussian curve with the above-calculated FWHM and maximum displacement parameters and so that the total time taken to the displacement corresponds to the exposure time required for producing the desired spatial variation of exposure dose at the fine-grating mask 31.

In a variant of this embodiment, the variable-transmission mask 28 may be displaced back and forth an integral number of times with the same inverted-Gaussian profile of speed variation but with a mean speed that is an integral number of times higher than that for a single scan (assuming the same intensity of illumination of the variable-transmission mask 28), to produce the same desired spatial variation of exposure dose at the fine-grating mask 31. In another variant the variable transmission mask 28 is displaced with a uniform speed and the intensity of light illuminating the mask is modulated so as to provide a Gaussian variation of incremental exposure dose with position of the variable-transmission mask 28. In other variants the displacement speed and the light intensity can be modulated so as to provide the said incremental exposure dose variation.

To avoid possible non-uniformity produced by imperfect time-integration of the intensity distribution illuminating the fine-grating mask 31 at the different separations of the fine-grating mask 31 and photoresist-coated wafer 33 during the DTL exposure, it is preferable that the time taken for a displacement scan of the variable-transmission mask 28 is much longer than that for a DTL scan of the mask-wafer separation, or vice versa.

In other variants of this second embodiment, the desired spatial variation of duty cycle in the surface-relief grating may be one-dimensional but in a direction that is instead parallel to the lines of the surface-relief grating or at an arbitrary angle with respect to the lines of the surface-relief grating. Alternatively, the desired duty cycle variation in the surface-relief grating may be monotonic or two-dimensional, that is, having components of duty cycle variation in both the x and y directions. In these variants, the variable-transmission mask 28 should be suitably designed as for the equivalent variants described for the first embodiment and illustrated in FIGS. 8-10.

In both the first and second embodiments and variants thereof it is important that the rate of change, or gradient, of the spatially varying duty cycle across the variable-transmission mask 28 is not too large otherwise an unacceptably large component of decollimation in the yz plane is introduced into the beam illuminating the fine-grating masks 9, 31 (see FIGS. 2 and 11). It arises because of the slight tilt of the edges of the line features of the variable-transmission mask with respect to the y axis that is produced by a varying duty cycle in the y direction. In particular, the component of decollimation, $\delta\phi_y$, locally introduced by the variable transmission mask may be estimated as:

$$\delta\phi_y = \frac{\lambda}{2(1-\alpha)} \cdot \left|\frac{\delta\alpha}{\delta y}\right|$$

where λ is the illumination wavelength, and α and $$\frac{\delta\alpha}{\delta y}$$

are respectively the local duty cycle and local rate of change of duty cycle in the y direction.

Evaluating the maximum value of $\delta\phi_y$ introduced over the area of the variable-transmission mask 7, 28 employed in the first and second embodiments, whose duty cycle variation is shown in FIG. 7, yields $\delta\phi_y\approx 3$ μR, which is negligible in relation to the ~0.8 mR divergence of the beam in the yz plane illuminating the variable-transmission mask.

Figure 12B:
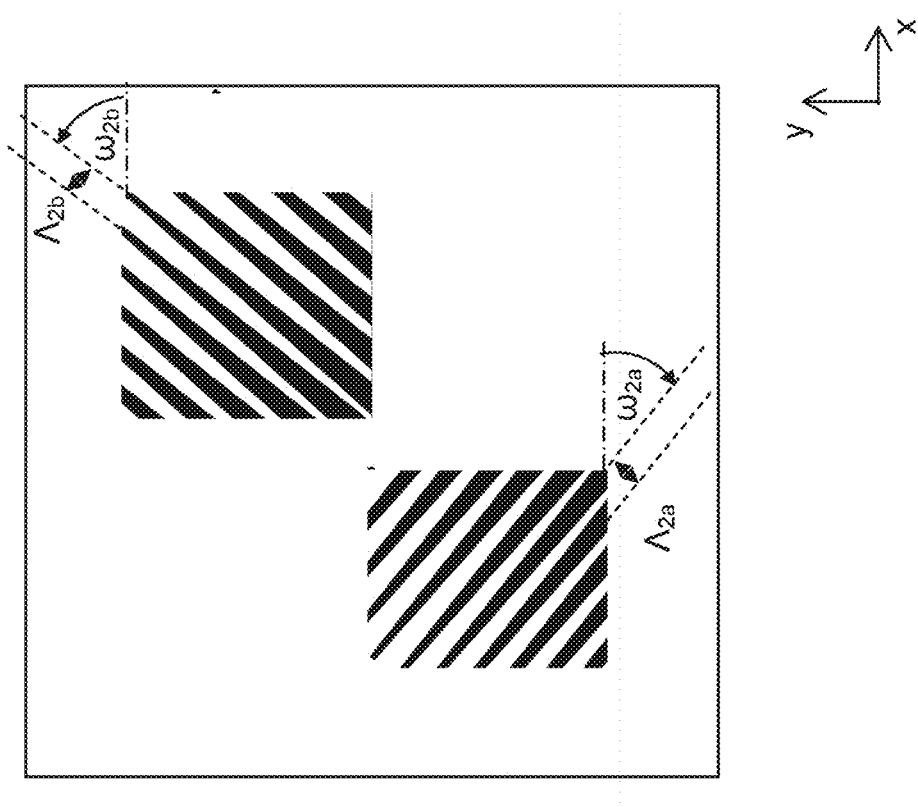
FIGS. 12a and 12b schematically illustrate respectively a fine-gratings mask and variable transmission gratings mask employed in a third embodiment of the present invention.
Figure 12A:
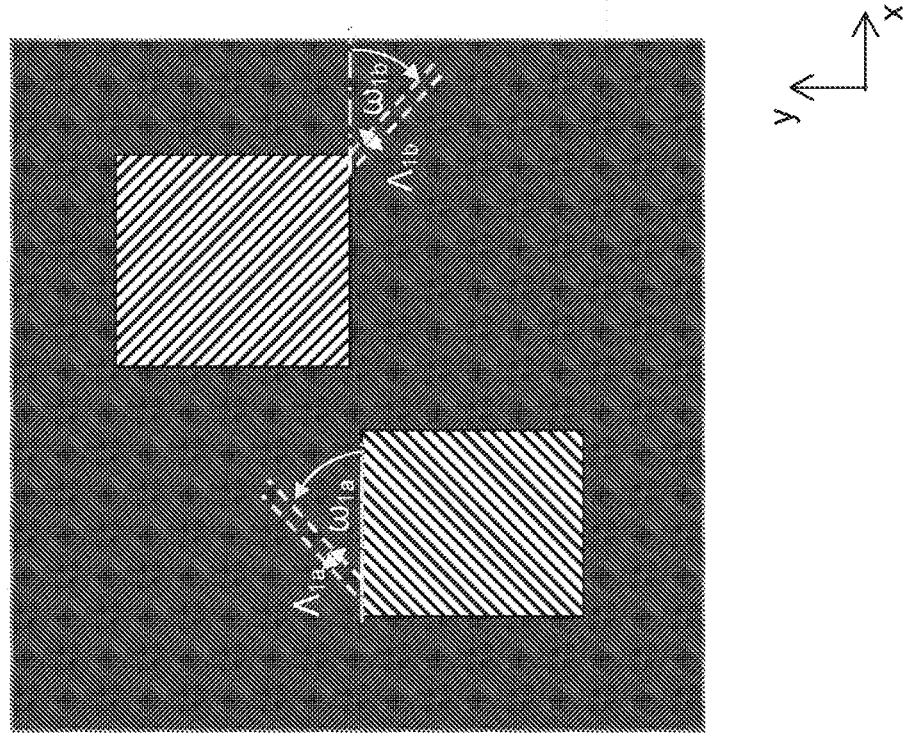

In a third embodiment, essentially the same exposure system as in the second embodiment is employed except that different designs of the variable-transmission and fine-grating masks are used for the purpose of printing two surface-relief gratings with different periods, different orientations of grating lines and different desired spatial variations of duty cycle onto a photoresist-coated wafer. With reference to FIG. 12a, the fine-grating mask bears instead two rectangular fine-grating patterns, labelled "a" and "b", with periods respectively of $\Lambda_{1a}=500$ nm and $\Lambda_{1b}=700$ nm, and line orientations of $\omega_{1a}=55°$ and $\omega_{1b}=-40°$ with respect to the x axis. With reference to FIG. 12b, the variable-transmission mask bears two corresponding rectangular gratings whose centres are at the same (x, y) coordinates as those of the two gratings in the fine-grating mask. The sizes of the gratings in the variable-transmission mask are preferably slightly larger than those in the fine-grating mask by the required additional width for the reason explained in the first embodiment (to ensure that the edges of the fine-gratings are also illuminated by all the diffraction orders of significant intensity from the variable-transmission mask). The two variable-transmission gratings have the same constant period (i.e. $\Lambda_{2b}=\Lambda_{2a}$) and their lines are oriented orthogonal to the lines of the corresponding grating in the fine-grating mask, so $\omega_{2a}=35°$ and $\omega_{2b}=50°$. As is illustrated in the figure, the duty cycle in each of the gratings has been designed to vary in a direction parallel to the lines of the respective variable-transmission grating in order that two surface-relief gratings with different periods are printed with the duty cycle in the two patterns varying in directions orthogonal to the grating line orientation of the respective pattern.

The two surface-relief gratings with their respective desired variations of duty cycle may be printed separately using sequential exposures and the same method as employed in the second embodiment and using substantially the same apparatus of that embodiment except, firstly, that the translation stage 30 is additionally equipped with a y-direction stage that allows the variable-transmission mask to be displaced in any direction; and, secondly, moveable apertures are provided for interposing in the beam path either before or after the variable-transmission mask so that just the "a" patterns or just the "b" patterns can be independently exposed. The exposure of two desired surface-relief gratings then proceeds by arranging the apertures so that just the "a" patterns are illuminated during the exposure, and displacing the variable-transmission mask during the exposure in the direction orthogonal to the lines of the "a" variable transmission grating in a manner as taught in the second embodiment. Following the exposure the apertures are then reconfigured so that just the "b" gratings can be exposed. The second exposure then proceeds with variable-transmission grating being displaced in the direction orthogonal to the lines of the "b" variable-transmission grating. The exposed photoresist-coated wafer is then developed. Using such independent exposures for the two gratings allows the exposure dose illuminating the variable-transmission mask to be different mask to be different for the two exposures. Having to use two exposures, however, can be undesirable for an industrial process.

Figure 1:
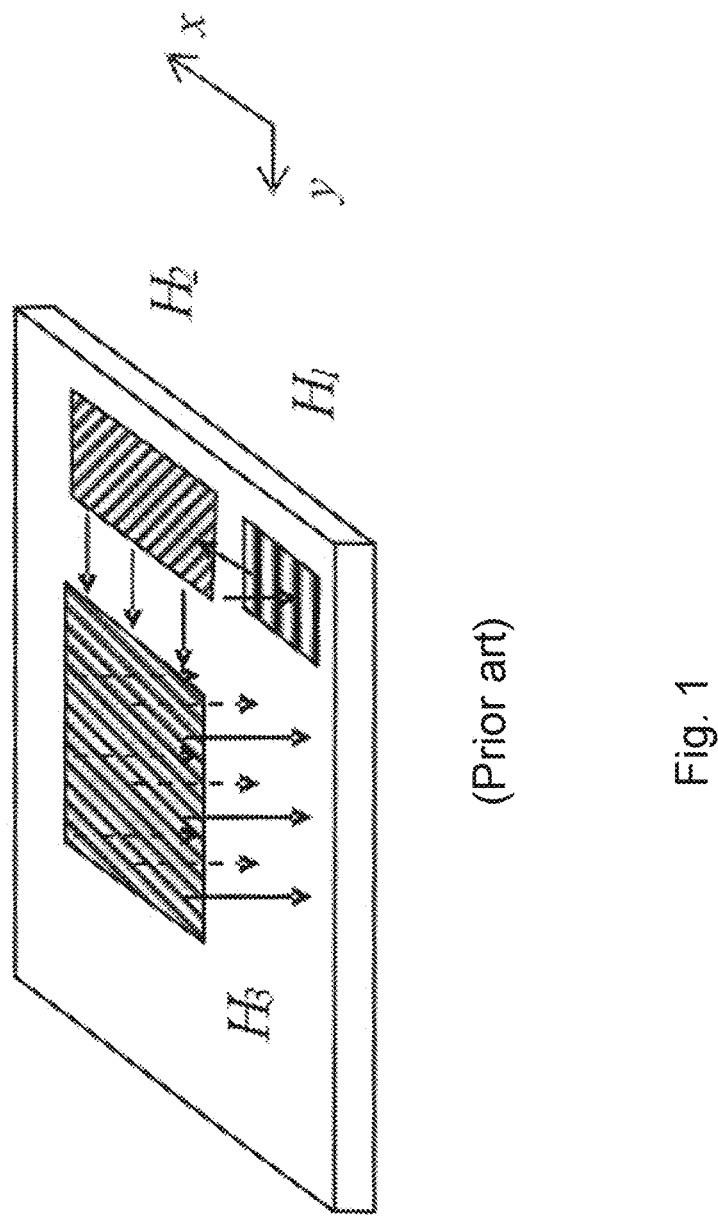
FIG. 1 schematically shows an arrangement of gratings in a compact virtual image display of the prior art.

A more advantageous exposure scheme is to print the "a" and "b" surface-relief gratings simultaneously in a single exposure. This may be achieved using the two masks of FIGS. 12a and 1b directly inserted in the illumination system of the second embodiment illustrated in FIG. 11. As explained in that embodiment it is not necessary that variable-transmission mask is displaced in a direction orthogonal to the lines of the variable-transmission grating, therefore the desired result may be obtained by exposing the "a" and "b" patterns simultaneously with the variable-transmission mask being displaced in a direction ideally bisecting the directions orthogonal to the lines in the two variable-transmission gratings (since the periods of the two variable transmission gratings are the same). This may be achieved by displacing the variable transmission mask in the x direction (which approximately bisects the $\omega_{2a}=35°$ and $\omega_{2b}=50°$ angles of the lines of the two variable-transmission gratings) using the translation stage 30. To eliminate the component of intensity-modulation introduced by periodic (and binary) nature of the gratings, the displacement should be performed so that a substantially Gaussian variation of exposure dose with position is obtained, as described in the second embodiments. The magnitudes of the FWHM distance and total distance of the Gaussian profile should be selected so that the components of displacement in the directions orthogonal to the lines of each variable-transmission grating satisfy, for both variable-transmission gratings, the requirements on S and T described in the second embodiment. The magnitudes of the FWHM distance and total distance of the Gaussian profile are minimized if the direction of displacement of the variable transmission mask bisects the directions perpendicular to the lines of the two variable-transmission gratings (if the two gratings have the same period).

In this third embodiment, the periods of the variable-transmission grating do not have to be the same but may be selected according to the orientations of the grating lines and according to the above requirements on S and T in order that the FWHM distance of the Gaussian displacement and the total displacement distance simultaneously satisfies the requirements on S and T for both gratings, thereby minimizing the displacement of the variable-transmission mask, and consequently maximizing the spatial resolution of duty cycle variation obtainable in the surface-relief gratings.

This methodology for printing two surface-relief gratings with different line orientations and different (or the same) desired variations of duty cycle may, in other embodiments, be extended for printing three or more surface-relief gratings with different line orientations and different (or the same) desired variations of duty cycle.

On a mask there may be one, two, three or more gratings which need to be used in a DTL or equivalent exposure to print gratings on a substrate. The gratings can be exposed separately in sequential exposures. However, it may be advantageous to expose them simultaneously in an exposure system. In the latter case, a number of halftone gratings can be prepared on a mask according to the teachings of this invention. Each variable-transmission, or halftone, grating is designed according to the desired duty cycle for the particular surface-relief grating it is used to print, which may be a constant duty-cycle across that grating or a variable duty cycle. The relative transmission of different halftone gratings on a mask have to be adjusted so that when they are exposed with the same incident dose each grating is printed with the desired duty cycle.

In order to avoid undesired intensity variations in the exposed field due to the presence of lines on the halftone mask the halftone mask can be displaced in a direction perpendicular to the orientation of lines on the halftone mask as discussed previously. When there is only one grating on the HT mask the movement can be perpendicular to the line orientation. For example, referring to FIG. 7, if the HT mask has only grating $G_1$ with period $p_1$ it can be moved by a distance $s_1$ as schematically indicated in the same figure. The distance $s_1$ is determined in relation to the period $p_1$ as discussed before. For example, one can require the distance $s_1$ to be greater than $p_1$ multiplied by a constant k. i.e. 3

$$s_1 \geq kp_1 \qquad [1]$$

It may be of interest to limit the movement distance to a minimum as discussed before.

However, if there is more than one grating with a different orientation of grating lines in each gratings (as schematically shown in FIG. 12a) the movement cannot be perpendicular to the directions of all HT grating lines at the same time. In such a case, it may be necessary to choose a direction and distance of movement so that all gratings are printed without the undesired intensity variations caused by lines of the halftone gratings. It may also be of interest to minimize the magnitude of such a movement for reasons discussed before. To find the minimum required distance we first consider the movement requirements for individual HT gratings as, $$s_i \geq k p_i \quad [2]$$

If the movement distance is S and its angle is θ, we can write the component of movement along the direction of $i^{th}$ grating as $$s_i = S \cos(\theta - \theta_i) \quad [3]$$

The range of values for the distance S and angle is θ can be found by satisfying relations 2 and 3 together. This problem can be solved with the help of a computer. Below we show two cases as examples.

Figure 13:
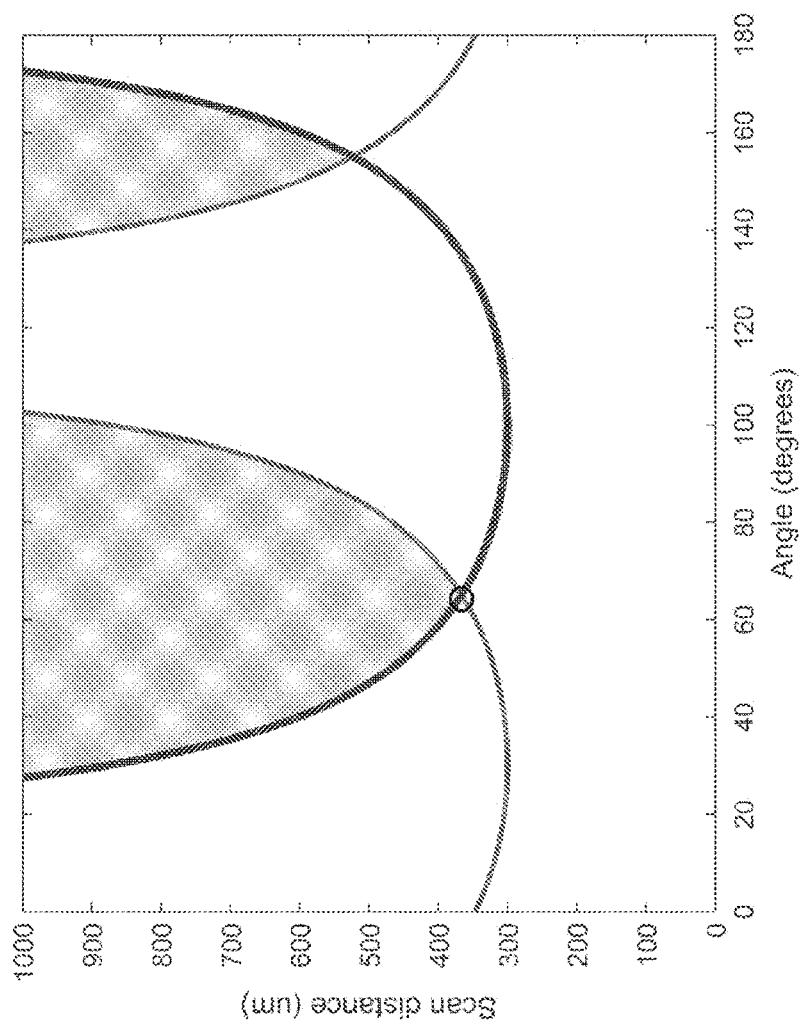
FIG. 13 schematically illustrates a methodology for determining the optimum direction and magnitude of displacement of the variable transmission mask for substantially eliminating the components of dose modulations produced by the periods of two variable-transmission gratings in the variable-transmission mask.

In case 1, there are two HT gratings on a mask with angles θ1=30° and θ2=100°. Both gratings have the same period, i.e. p1=p2=50 um. In this example, the value for the multiplicative constant k is taken as 6. The region above the blue curves in FIG. 13 shows the range of values for S and θ, for which the corresponding scan satisfies the uniformity requirement for grating G1. Likewise, the parameter space above the red curve satisfies the uniformity requirement for grating G2. In order to find acceptable values for s and θ which satisfies the requirements for both gratings, one can take the overlap of the two regions described above for individual gratings. This region is shown with gray color in FIG. 13. By inspecting this plot we find that the minimum required movement distance is 366 um and its angle θ=65°.

Figure 14:
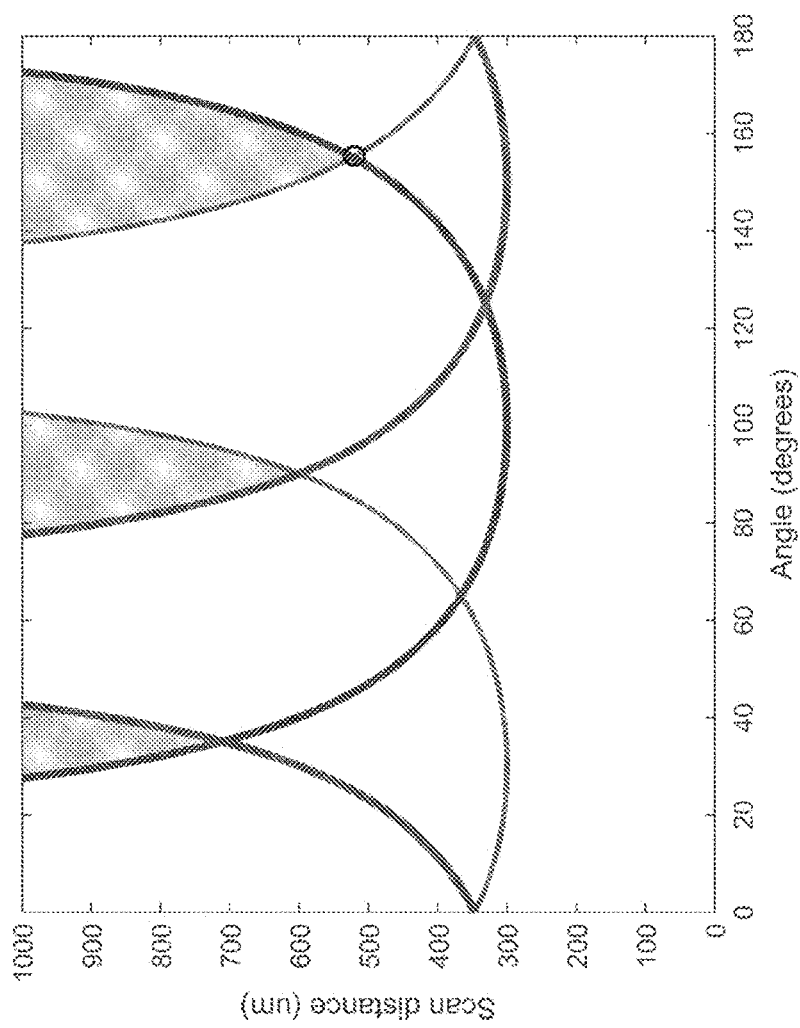
FIG. 14 schematically illustrates a methodology for determining the optimum direction and magnitude of displacement of the variable transmission mask for substantially eliminating the components of dose modulations produced by the periods of three variable-transmission gratings in the variable-transmission mask.

In case 2, there are three HT gratings on a mask with angles θ1=30°, θ2=100° and θ3=150°. All three gratings have the same period, i.e. p1=p2=p3=50 um. In this example, the value for the multiplicative constant k is taken as 6. The region above the blue curves in FIG. 14 shows the range of values for S and θ, for which the corresponding scan satisfies the uniformity requirement for grating G1. The parameter space above the red curve satisfies the uniformity requirement for grating G2. Finally, the parameter space above the magenta curve satisfies the uniformity requirement for grating G3. In order to find acceptable values for s and θ which satisfies the requirements for all three gratings, one can take the overlap of the three regions described above for individual gratings. This region is shown with gray color in FIG. 14. By inspecting this plot we find that the minimum required movement distance is 523 um and its angle θ=155°.

Figure 15:
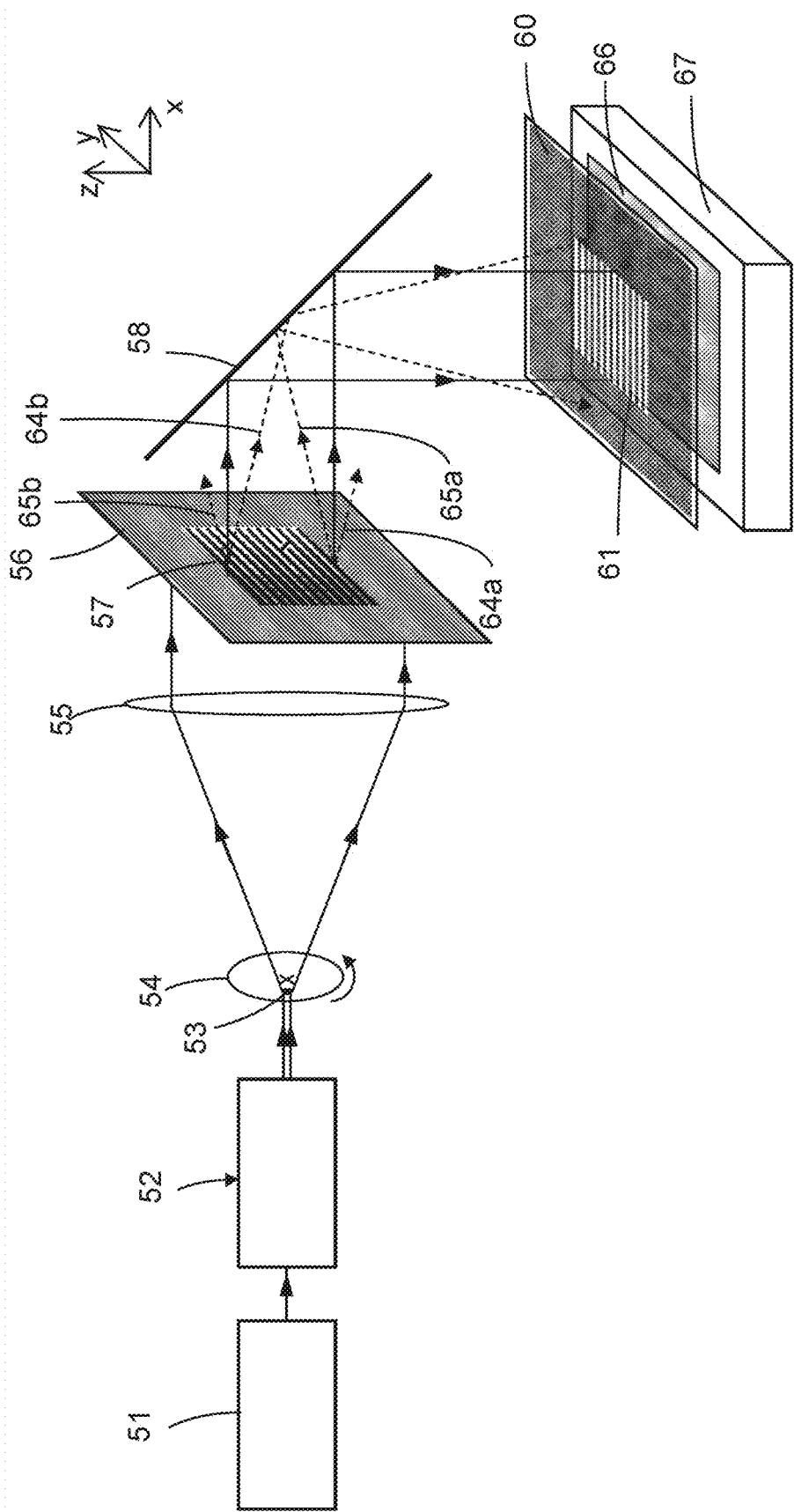
FIG. 15 schematically illustrates a third embodiment of the invention in which just a $0^{th}$-diffracted order from a variable-transmission mask illuminates a fine-grating mask.

A third exemplary embodiment of the invention is shown schematically in FIG. 15. Similarly to the second embodiment, an ArF excimer laser 51 emits a beam of pulsed light whose dimensions are modified by a beam transformer 52 to produce a ~square beam of collimated light with FWHM dimensions ~2 mm×2 mm (z x y). The beam is incident on a diffuser 53 that scatters the light homogenously over a narrow range of angles with a half-cone angle of ~2.5°. The diffuser is mounted to a motorized stage (not shown) for rotating the diffuser in order to further improve the intensity homogenization over the range of angles. The scattered light is collimated by a lens 55 of focal length ~2.4 m to produce a beam of substantially uniform intensity with diameter ~200 mm whose rays have FWHM angular distribution of ~0.8 mR at any point in the beam. The beam illuminates a mask 56 bearing a variable-transmission grating 57 formed in a layer of chrome on a fused silica substrate. Similar to the variable-transmission mask employed in the second embodiment and illustrated in FIG. 3, the grating 57 has area ~50 mm×50 mm and comprises alternating chrome lines 15 and spaces with a constant period and a duty cycle that varies across the grating 57 in a direction parallel to the grating lines. The mask 56 is oriented so that the lines of the variable-transmission grating 57 are parallel to the y axis in FIG. 15. The illumination of the grating 57 produces a number of diffraction orders: a $0^{th}$-order beam that passes through the mask without angular deflection, $\pm 1^{st}$-order beams diffracted at angles of $\pm\arcsin(\lambda/\Lambda)$, where λ is the illumination wavelength and Λ is the period of the grating 57, as well as higher orders diffracted at larger angles. The $0^{th}$-order beam is reflected by a mirror 58 such that it illuminates, at normal incidence, a fine grating 61 in a mask 60 that is supported by a chuck (not shown). The upper and lower edges of the $0^{th}$-order beam are indicated with solid lines in the figure, whereas the upper and lower edges of the $+1^{st}$ and $-1^{st}$ orders are indicated by dashed lines 64a,b and 65a,b respectively. The light-field transmitted by the fine-grating 61 illuminates a photoresist-coated glass wafer 66 located on a vacuum chuck that is mounted on a z-direction displacement stage of a DTL-exposure system (not shown).

The period of the grating 57 in the "$0^{th}$-order" variable-transmission mask 56 is, however, much smaller than that in the variable-transmission mask of the second embodiment, and is selected in relation to the wavelength of illumination and in conjunction with the separations between the variable-transmission mask 56 and the mirror 58 and between the mirror 58 and the fine-pitch grating mask 60, so that only the $0^{th}$-order diffracted beam illuminates the fine-pitch grating 61. Specifically, the period of the variable-transmission grating is selected to be 2 μm and the total distance travelled by the $0^{st}$-order beam from the variable-transmission mask 56 to the fine-grating mask 61 is arranged to be 700 mm, so that the angles of the $\pm 1^{st}$ orders beams of 193 nm wavelength diffracted by the variable-transmission mask 57 are $\sim\pm 5.5°$ and the resulting lateral offset of the $\pm 1^{st}$ orders with respect to the $0^{th}$ order at the plane of the fine-grating mask is >60 mm, and so larger than the 50 mm dimension of the fine-pitch grating 61 in the x-direction, thereby ensuring that only the $0^{th}$ order illuminates the fine-pitch grating 61. To facilitate fabrication of the required spatial variation of duty cycle in the variable-transmission mask using conventional mask-writing techniques while enabling a reasonably compact illumination system for the DTL exposure, it is recommended that the period of the grating 57 in the variable-transmission mask 56 be in the range 1-5 μm.

The spatial variation of duty cycle over the variable-transmission grating 57 is designed to produce a required spatial variation of intensity in the $0^{th}$-order beam illuminating the fine-grating mask 60 in order that an exposure using Displacement Talbot Lithography prints a grating with a desired spatial variation of linewidth on the photoresist-coated substrate (determined by a characterization of the DTL photoresist exposure process, as described in the earlier embodiments). The $0^{th}$-order diffraction efficiency, $\eta_0$, of a grating comprising alternating chrome lines and transparent spaces, i.e. an amplitude grating, that has a duty cycle, f, is given by 0

$$\eta_0 = (1-f)^2,$$

So, for example, if the duty cycle is 0.4, i.e. the width of the chrome lines is 0.4 times the grating period, then the intensity of the $0^{th}$-order beam transmitted by the variable-transmission mask is 0.36 (i.e. 36%).

The spatial variation of intensity of the $0^{th}$-order beam, $I(z,y)$, transmitted by a spatial variation of duty cycle, $f(z,y)$, in the mask 56 illuminated by a beam with uniform intensity, $I_0$, is therefore given by $$I(z, y) = I_0\{1 - f(z, y)\}^2,$$

Since the beam illuminating the mask is well collimated and the rate, or gradient, with which the duty cycle is required to vary across the mask 56 for the application concerned is slow so that negligible angular divergence of light is introduced into the $0^{th}$-order beam by diffractive effects from the gradient of the duty cycle variation, the intensity variation of the beam $I(z,y)$ transmitted by the variable-transmission mask is accurately transferred, i.e. maps substantially 1:1, to the intensity distribution $I(x,y)$ illuminating the fine-pitch grating mask 60.

The above expression for $I(z,y)$ can therefore be directly employed for calculating the duty cycle variation, $f(z,y)$, required over the variable-transmission mask 56 for producing a particular intensity variation, $I(x,y)$, in the beam incident on the fine-grating mask so that a desired spatial variation of duty cycle can be obtained in the photoresist.

Whereas in the earlier embodiments (in which essentially all the diffraction orders from the variable-transmission mask illuminate the fine-grating mask), it is important that the orientation of the lines of the variable-transmission grating is orthogonal to the direction of the lines of the fine-pitch grating, in this embodiment it is generally unimportant because the $1^{st}$ and higher diffracted orders are prevented from illuminating the fine-pitch grating so the angular distribution of the light in those other orders cannot illuminate the fine-grating mask and degrade the resolution of the fine-pitch grating printed into the photoresist. For this reason, the orientation of the lines of the variable-transmission grating illustrated in FIG. 15 may alternatively be in the z or any other direction.

Whereas it is preferable that the beam illuminating the variable-transmission mask 56 is well-collimated so that the intensity distribution illuminating the fine-pitch grating mask is substantially the same as the intensity distribution transmitted by the variable transmission mask 56, it is not absolutely necessary. For example, if, in another embodiment, the beam illuminating the variable-transmission mask has some significant spherical aberration, then the projection of the rays over the extent of the $0^{th}$-order beam from the variable-transmission mask to the fine-pitch mask should be mapped, and compensated for in the design of the variable-transmission mask 56. The compensation should preferably also take account of the modulation of intensity that is introduced into the propagating beam by the spherical aberration.

In a variant of this embodiment, the variable-transmission mask is instead located before the collimating lens 55, and is designed to compensate for the mapping of the rays of the $0^{th}$-order beam from the coordinate system of the variable-transmission mask to the plane of the fine-pitch grating mask, and preferably compensate also for any intensity modulation intensity modulation introduced into the beam as the $0^{th}$ order propagates from the variable-transmission mask.

Figure 16:
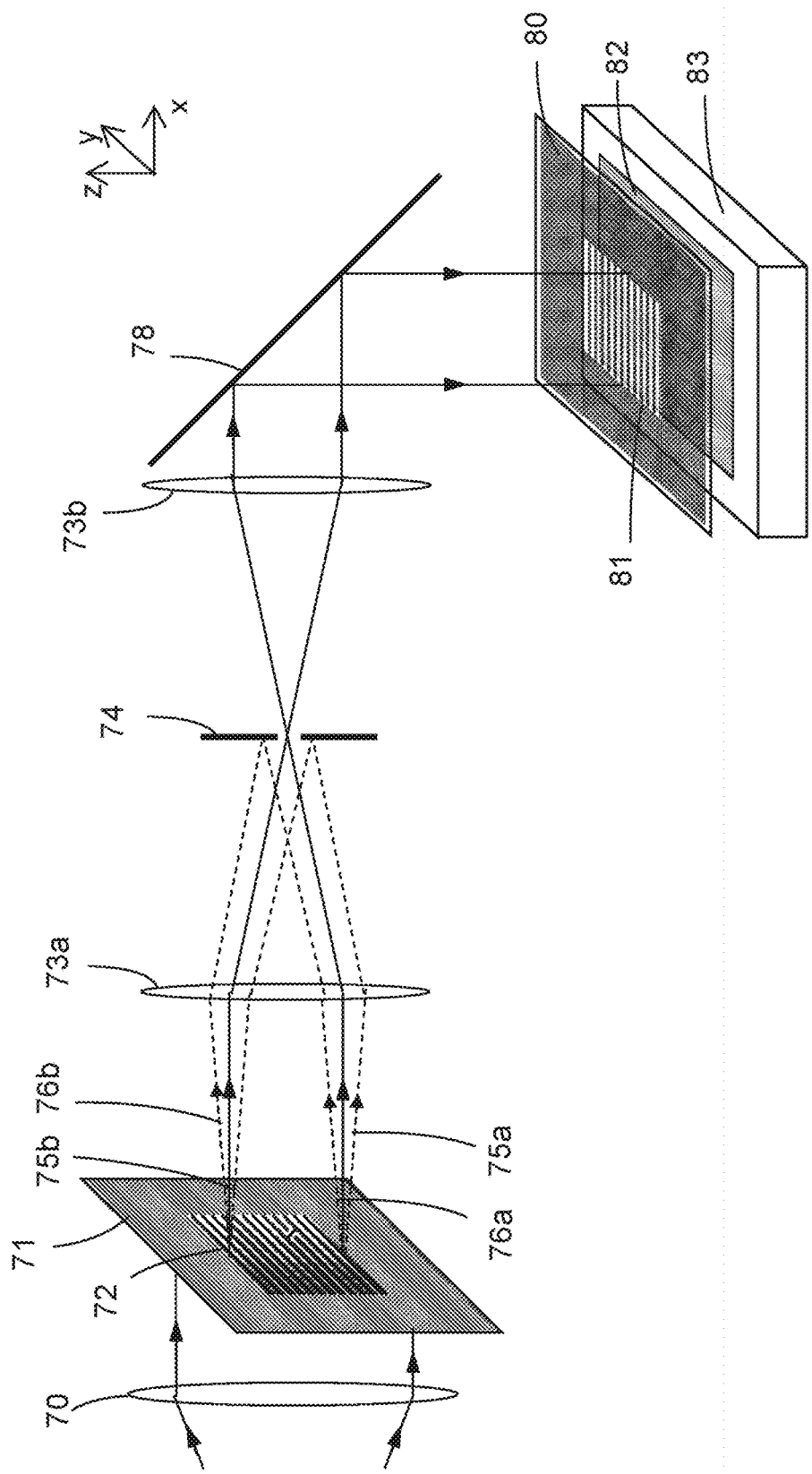
FIG. 16 schematically illustrates a fourth embodiment of the invention in which $1^{st}$ and higher-orders are spatially filtered by a 4f imaging system so that just a $0^{th}$-diffracted order from a variable-transmission mask illuminates a fine-grating mask.

A fourth embodiment, also employing a "$0^{th}$-order" variable-transmission mask, is schematically illustrated in FIG. 16. A divergent beam derived from the same illumination source and beam shaping optics as employed in the third embodiment (not shown) is incident on a lens 70 that produces a beam of collimated light. The beam illuminates a variable-transmission mask 71 bearing a similar periodic pattern of chrome lines and transparent spaces as that employed in the third embodiment except that the period of the pattern is 20 µm, so much larger. The $0^{th}$-, $1^{st}$- and higher-order beams diffracted by the variable-transmission mask 71 are incident on the first lens 73a of a so-called 4f-imaging system which focusses the beams to an array of spots in the back focal plane of the lens 73a. The rays at the upper and lower limits of the $0^{th}$-order are represented by solid lines in the figure whilst the upper and lower limits of the +$1^{st}$ and −$1^{st}$ orders are represented by dashed lines 75a,b and 76a,b respectively. At the back focal plane of the lens is a spatial filter in the form of an aperture in an opaque screen that is centered on the optical axis of the 4f system lenses 73a, b. The size of the aperture is selected in relation to the period of the variable-transmission grating 72 and the focal length of the lens 73a so that only the light of the $0^{th}$-order beam pass through the aperture, all other diffraction orders being blocked. The $0^{th}$-order beam is then re-collimated by the second lens 73b of the 4f system from where the beam is reflected by a mirror so that it illuminates a fine-pitch grating 81 in a mask 80 at normal incidence. The focal lengths of the two lenses 73a, b are the same so that the intensity distribution of the $0^{th}$-order beam transmitted by the variable-transmission mask 71 is imaged with magnification 1 onto the fine-pitch grating 81. The light transmitted by the fine-pitch grating 81 illuminates a photoresist coated substrate on a chuck 83 mounted to a DTL exposure system (not shown).

The 1:1 imaging of the $0^{th}$-order beam from the variable-transmission mask and blocking of the other diffraction orders produced by the 4f imaging lenses 73a, b and spatial filter 74 of this embodiment are therefore equivalent to the projection of the $0^{th}$-order beam over a large distance and lateral separation of the other diffraction orders produced in the third embodiment. The variable-transmission mask employed in this embodiment is therefore designed in the same manner as in the third embodiment.

It should be understood that the two lenses 73a, b of the 4f imaging system are only shown schematically (as singlets) and should be designed using standard optical design principles so that the spatial variation of intensity of the $0^{th}$-order beam transmitted by the variable-transmission grating 72 is imaged with the accuracy required onto the fine-grating pattern 81. Whereas the two lenses 73a,b of the 4f imaging system shown in FIG. 16 have the same focal length and produce a 1:1 imaging of the $0^{th}$-order beam onto the fine-grating mask, in other variants of this embodiment, the ratio of the focal lengths of the lenses of the 4f imaging system can be different in order to produce a magnified (or de-magnified) image of the $0^{th}$-diffracted order on the fine-grating mask. In such a case, the coordinate system of the duty cycle variation within the variable-transmission mask should be suitably de-magnified or magnified to compensate for the magnification or demagnification respectively produced by the imaging.

Whereas the variable-transmission masks in FIGS. 15 and 16 are dark-field masks, i.e. with chrome surrounding the grating pattern 57, this is not essential: in other variants of these embodiments they may instead be light-field masks, i.e. with no chrome surrounding the grating pattern.

Whereas the variable-transmission masks employed in the third and fourth embodiments described above have duty cycles that vary across the mask in the y direction for the purpose of producing a desired y-direction variation of duty cycle in the grating printed in the photoresist, it should be understood that in other variants of these embodiments, the variation of duty cycle desired in the photoresist may be in another direction or may be a two-dimensional variation across the grating, in which case the spatial variation of duty cycle across the variable-transmission mask should be appropriately designed.

Whereas the $0^{th}$-order variable-transmission masks described in the above embodiments are amplitude masks, that is the gratings are in form of alternating lines of transparent and opaque material, in other, related embodiments they may instead be phase shift masks, partially transmitting chrome, or attenuated phase shift masks, in which the thickness and linewidths of the particular materials employed are suitably designed for obtaining the required spatial variation of intensity in the transmitted $0^{th}$-order beam.

Whereas the $0^{th}$-order variable-transmission masks described in the above embodiments bear linear gratings with varying duty cycle and constant period, the latter is not an essential feature (though simplifies the design) and the (local) period may alternatively vary across the pattern. It is important though that the extent of this variation should allow, in the case of the third embodiment, the lateral separation of the $1^{st}$ orders from the $0^{th}$ order at the plane of the fine-grating mask, in the case of the fourth embodiment, allow the transmission of the $0^{th}$ order and blocking of the $1^{st}$ and higher orders by the spatial filter. In these alternative embodiments, the spatial variation of duty cycle for obtaining a particular variation of intensity at the fine grating mask can be designed in the same manner as described for those embodiments.

Whereas the variable-transmission gratings described in the third and fourth embodiments employ linear gratings composed of lines and spaces with varying duty cycle for producing the required spatial variation of intensity in the $0^{th}$ diffracted order, in other related embodiments the variation of intensity in the $0^{th}$ order may instead be produced by a variation of the size of features arranged in a two-dimensional array, for instance, features arranged on a square or hexagonal grid. Similarly, it is not essential that the grid be perfectly periodic, but the period, or nearest-neighbor distance, may vary in at least one direction. For such two-dimensional arrays of features on periodic or non-periodic grids, the spatial variation of the duty cycle of the features (defined as the area of the feature area divided by area of local cell within grid) should be designed in analogous fashion to the linear grating case. As for the third and fourth embodiments, the period of the two-dimensional arrays should be arranged in relation to the optical system so that only the $1^{st}$ and higher diffracted orders are either spatially separated from the $0^{th}$ order at the plane of the fine-grating mask or are blocked by a spatial filter in a 4f imaging system.

In other embodiments, a $1^{st}$ diffraction order from a variable-transmission mask rather than the $0^{th}$ order is instead used to illuminate the fine-grating mask. In such an embodiment, a system similar that illustrated in FIG. 15 is employed except the mirror 58 is positioned and oriented to reflect one of the two $1^{st}$ orders diffracted from the mask such that it illuminates the fine-grating mask at normal incidence; and the duty cycle variation within the variable-transmission mask is suitably designed (using linear grating diffraction efficiency formula well-known to a skilled person in the art) such that the required intensity distribution is produced within the $1^{st}$-order beam. Analogously to the third embodiment, the period of the grating in the variable-transmission mask and the distance of the $1^{st}$-order's optical path from the variable transmission mask to the fine-grating mask should be arranged so that $1^{st}$ order is laterally separated from the $0^{th}$-order and neighboring $2^{nd}$ order at the plane of the fine grating mask. In another such embodiment, a system similar to that illustrated in FIG. 16 may be used, except the spatial filter 74 is repositioned to enable just a $1^{st}$-order to pass through the aperture and all other orders be blocked, and the tilt of the mirror 78 is arranged so that that the light of the $1^{st}$ order re-collimated by the lens 73b is reflected to illuminate the fine-grating mask at normal incidence. The duty-cycle variation within the variable-transmission mask is designed appropriately to produce the required the intensity variation within the first-order beam that illuminates the fine-grating mask.

In other variants of the "$0^{th}$-order" or "$1^{st}$-order" embodiments, optical systems with the same function as the combination of the 4f imaging system and spatial filter may be alternatively configured between the variable transmission grating for allowing passage of just respectively the $0^{th}$ and a $1^{st}$ diffraction order so that it alone illuminates the fine-period grating.

Whereas all the above embodiments describe exposure systems with an ArF excimer laser source, in other embodiments alternative illumination sources may be employed, most preferably laser sources, producing a beam of light or radiation at another wavelength, especially at a deep-UV or near-UV wavelength. For such another wavelength, a suitable photoresist sensitive that wavelength should employed. The optical elements of the beam-generating optical system would also need to be selected and configured for the wavelength concerned. Whereas a mirror is shown in the figures for the above embodiments, this is optional and is simply for folding the beam so as to produce a more compact system. In other embodiments no mirror or more mirrors may be alternatively used.

Whereas the above embodiments only describe surface-relief gratings with desired variations of duty cycle being printed into photoresist above one surface of a substrate, in other embodiments a surface relief-grating with the same or another desired variation of duty cycle may subsequently printed into another layer of photoresist on the other side of substrate using another exposure after forming the surface-relief structure on the first surface). For this it is advantageous if a standard alignment system, for example a pair of suitable microscopes, is included on the exposure system, and suitable alignment marls are included in the design of the mask patterns so that an accurate positional and rotational alignment can be achieved between the patterns printed on the two surface of the substrate.

The invention claimed is:

1. A method based on displacement Talbot lithography for forming a desired surface-relief grating of periodic linear features having a spatial variation of duty cycle in a layer of a photoresist on a substrate, the method comprising:
   a) providing a first mask with a first high-resolution grating of linear features having a period that is twice a resolution of the desired surface-relief grating;

b) arranging the substrate and the first mask in a displacement Talbot lithographic system, with the first mask being parallel to and at a first distance from the substrate;

c) providing a second mask with a first variable-transmission grating of alternating opaque and transparent linear features that has a period and a designed spatial variation of duty cycle;

d) arranging the second mask parallel to and at a second distance from the first mask on an opposite side of the first mask from the substrate, and with the linear features of the first variable-transmission grating orthogonal to the linear features of the first high-resolution grating;

e) generating a beam of monochromatic light for illuminating the second mask such that the light incident on the second mask is well-collimated in a plane of incidence that is parallel to the linear features of the first variable-transmission grating, and has a pre-determined distribution of angles of incidence in the plane that is orthogonal to the linear features of the first variable-transmission grating so that diffracted beams transmitted by the first variable-transmission grating illuminate the first high-resolution grating;

f) illuminating for an exposure time the second mask with the beam while varying the first distance according to displacement Talbot lithography, wherein a light-field transmitted by the first high-resolution grating exposes the photoresist to an energy density distribution for forming the desired surface-relief grating;

wherein the spatial variation of duty cycle in the first variable-transmission grating is designed based on a predetermined dependence of the duty cycle of a surface-relief grating formed using displacement Talbot lithography on the energy density of the beam illuminating the first mask in the absence of the second mask and according to the spatial variation of duty cycle of the desired surface-relief grating;

wherein the second distance and the predetermined distribution of angles of incidence are selected in relation to a period of the first variable-transmission grating so that there is substantially no component of modulation with the period of the first variable-transmission grating in the energy density distribution that exposes the photoresist in the exposure time.

2. The method according to claim 1, wherein the spatial variation of duty cycle of the desired surface-relief grating is one-dimensional and in a direction that is either parallel or orthogonal and at an intermediate angle with respect to a direction of the linear features of the surface-relief grating.

3. The method according to claim 1, wherein the spatial variation of duty cycle of the desired surface-relief grating is one-dimensional, either linear or non-linear, and is either monotonic or non-monotonic.

4. The method according to claim 1, wherein the spatial variation of duty cycle of the desired surface-relief grating is two-dimensional with components of variation in directions that are respectively parallel and orthogonal to the linear features of the surface-relief grating.

5. The method according to claim 1, wherein the spatial variation of duty cycle of the desired surface-relief grating is two-dimensional with components of variation in directions respectively parallel and orthogonal to the linear features of the desired surface-relief grating and which are any of linear, non-linear, monotonic and non-monotonic variations.

6. The method according to claim 1, wherein the period of the first variable-transmission grating is either constant or variable over an area of the first variable-transmission grating, or the period of the first variable-transmission grating is constant over the area of the first variable-transmission grating and is substantially larger than the period of the first high-resolution grating.

7. A method based on displacement Talbot lithography for forming a desired surface-relief grating of periodic linear features having a spatial variation of duty cycle in a layer of photoresist on a substrate, the method comprising:

a) providing a first mask with a first high-resolution grating of linear features having a period that is twice a period of the desired surface-relief grating;

b) arranging said first mask parallel to and at a first distance from the substrate;

c) providing a second mask with a first variable-transmission grating of alternating opaque and transparent linear features that has a period and a designed spatial variation of duty cycle;

d) arranging the second mask parallel to and at a second distance from the first mask on an opposite side of the first mask from the substrate, and with the linear features of the first variable-transmission grating orthogonal to the linear features of the first high-resolution grating;

e) generating a beam of monochromatic light for illuminating the second mask such that the light incident on the second mask is well-collimated in a plane of incidence that is parallel to the linear features of the first variable-transmission grating, so that the diffracted beams transmitted by the first variable-transmission grating illuminate the first high-resolution grating;

f) illuminating for a given exposure time the second mask with the beam while varying the first distance according to displacement Talbot lithography and displacing the second mask, wherein the light-field transmitted by the first high-resolution grating exposes the photoresist to an energy density distribution for forming the desired surface-relief grating;

wherein the displacement of the second mask is arranged in relation to the period and direction of the linear features of the first variable-transmission grating such that there is substantially no component of modulation with the period of the first variable-transmission grating in an energy density distribution that exposes the photoresist in the given exposure time; wherein the spatial variation of duty cycle in the first variable-transmission grating is designed based on a predetermined dependence of the duty cycle of a surface-relief grating formed using displacement Talbot lithography on the energy density of the beam illuminating the first mask in the absence of the second mask and according to the spatial variation of duty cycle of the desired surface-relief grating.

8. The method according to claim 7, wherein the spatial variation of duty cycle of the desired surface-relief grating is one-dimensional and in a direction that is either parallel or orthogonal and at an intermediate angle with respect to a direction of the linear features of the surface-relief grating.

9. The method according to claim 7, wherein the spatial variation of duty cycle of the desired surface-relief grating is one-dimensional, either linear or non-linear, and is either monotonic or non-monotonic.

10. The method according to claim 7, wherein the spatial variation of duty cycle of the desired surface-relief grating is two-dimensional with components of variation in directions that are respectively parallel and orthogonal to the linear features of the surface-relief grating.

11. The method according to claim 7, wherein the spatial variation of duty cycle of the desired surface-relief grating is two-dimensional with components of variation in directions respectively parallel and orthogonal to the linear features of the desired surface-relief grating and which are selected from the group consisting of linear, non-linear, monotonic, and non-monotonic variations.

12. The method according to claim 7, wherein the period of the first variable-transmission grating is either constant or variable over an area of the first variable-transmission grating, or the period of the first variable-transmission grating is constant over the area of the first variable-transmission grating and is substantially larger than the period of the first high-resolution grating.

13. The method according to claim 7, which comprises displacing the second mask in a direction orthogonal to the linear features of the first variable-transmission grating and by a distance of a period or a plurality of periods of the variable-transmission grating and with a constant speed of displacement during the exposure time.

14. The method according to claim 7, which comprises displacing the second mask in a direction orthogonal to the linear features of the first variable-transmission grating and by a distance of a period or a plurality of periods of the variable-transmission grating using a constant speed of displacement, and then displacing the second mask in an opposite direction by a distance of a period or a plurality of periods of the variable-transmission grating using the same or a different constant speed of displacement.

15. The method according to claim 7, which comprises displacing the second mask in a direction orthogonal to the linear features of the first variable-transmission grating and using a variable speed of displacement that generates a dependence of incremental exposure dose of the first variable-transmission mask on distance of displacement that has a substantially Gaussian profile.

16. The method according to claim 7, configured for additionally and simultaneously forming at least a second desired surface-relief grating of periodic linear features with a second period and a second spatial variation of duty cycle in the layer of photoresist,
   providing the first mask additionally with at least a second high-resolution grating of linear features with a period that is twice that of the second desired surface-relief grating;
   providing the second mask additionally with at least a second variable-transmission grating of alternating opaque and transparent linear features that has a second period and a second designed spatial variation of duty cycle;
   the step of arranging the second mask with respect to the first mask additionally arranges at least the linear features of the second variable-transmission grating orthogonally to the linear features of the second high-resolution grating;
   the step of generating the beam of monochromatic light for illuminating the second mask forms the beam such that the light incident on the second mask is additionally well-collimated in the plane of incidence that is parallel to the linear features of the at least second variable-transmission grating, wherein the diffracted beams transmitted by the second variable-transmission grating illuminate the second high-resolution grating;
   the step of illuminating for an exposure time the second mask with said beam while varying the first distance according to displacement Talbot lithography and displacing the second mask, additionally exposes the photoresist to an energy density distribution for forming the second desired surface-relief grating; and
   wherein the displacement of the second mask is additionally arranged in relation to the period and the direction of the linear features of the at least second variable-transmission grating such that there is substantially no component of modulation with the period of the second variable-transmission grating in the energy density distribution that exposes the photoresist in the exposure time;
   wherein the spatial variation of duty cycle in the second variable-transmission grating is designed based on a pre-determined dependence of the duty cycle of a surface-relief grating formed using displacement Talbot lithography on the energy density of the beam illuminating the first mask in the absence of the second mask and according to the spatial variation of duty cycle of the desired second surface-relief grating.

17. The method according to claim 7, wherein the first mask bears first and second high-resolution gratings of linear features, wherein the direction of the linear features of the first high-resolution grating are at an oblique angle with respect to the direction of the linear features of the second high-resolution grating; in which the second mask bears first and second variable-transmission gratings of linear features whose first and second periods are the same and wherein the direction of the linear features of the first variable-transmission grating is at the same oblique angle with respect to the linear features of the second variable-transmission grating; and wherein the displacement of the second mask is arranged to be in a direction that angularly bisects the directions perpendicular to the linear features of the respective first and second variable-transmission gratings.

18. An apparatus based on displacement Talbot lithography for forming a desired surface-relief grating of periodic linear features with spatial variation of duty cycle in a layer of photoresist over a substrate, the apparatus comprising:
   a) a first mask bearing a first high-resolution grating of linear features with a period that is twice the period of the desired surface-relief grating;
   b) a device for arranging said first mask parallel to and at a first distance from the substrate;
   c) a second mask bearing a first variable-transmission grating of alternating opaque and transparent linear features that has a period and a designed spatial variation of duty cycle;
   d) a device for arranging said second mask parallel to and at a second distance from said first mask on an opposite side of said first mask from the substrate, and such that the linear features of the first variable-transmission grating are orthogonal to the linear features of the first high-resolution grating;
   e) a light source configured for generating a beam of monochromatic light for illuminating the second mask such that light incident on the second mask is well-collimated in a plane of incidence that is parallel to the linear features of the first variable-transmission grating and has a predetermined distribution of angles of incidence in the plane that is orthogonal to the direction of the linear features of the first variable-transmission grating, so that diffracted beams transmitted by said first variable-transmission grating illuminate the first high-resolution grating; and
   f) a device for illuminating for an exposure time the second mask with the beam while varying the first distance according to displacement Talbot lithography, wherein the light-field transmitted by the first high-resolution grating exposes the photoresist to an energy density distribution for forming the desired surface-relief grating.

19. An apparatus based on displacement Talbot lithography for forming a desired surface-relief grating of periodic linear features with a spatial variation of duty cycle in a layer of photoresist on a substrate, the apparatus comprising:
   a) a first mask bearing a first high-resolution grating of linear features with a period that is twice a period of the desired surface-relief grating;
   b) a device for arranging said first mask parallel to and at a first distance from the substrate;
   c) a second mask bearing a first variable-transmission grating of alternating opaque and transparent linear features that has a period and a designed spatial variation of duty cycle;
   d) a device for arranging said second mask parallel to and at a pre-determined second distance from said first mask on an opposite side of said first mask from the substrate, and such that the linear features of the first variable-transmission grating are orthogonal to the linear features of the first high-resolution grating;
   e) a light source for generating a beam of monochromatic light for illuminating said second mask such that the beam incident on said second mask is well-collimated in a plane of incidence that is parallel to the linear features of the first variable-transmission grating, so that diffracted beams transmitted by the first variable-transmission grating illuminate the first high-resolution grating;
   f) a device for displacing the second mask in relation to the period and direction of the linear features of the first variable-transmission grating while illuminating said second mask such that there is substantially no component of modulation with the period of the first variable-transmission grating in the energy density distribution that exposes the photoresist in the exposure time for forming the desired surface-relief grating; and
   g) a device for varying the first distance according to displacement Talbot lithography.

20. A method based on displacement Talbot lithography for forming a desired surface-relief grating of periodic linear features with a spatial variation of duty cycle in a layer of photoresist on a substrate, the method comprising:
   a) providing a first mask with a first high-resolution grating of linear features with a period that is twice a period of the desired surface-relief grating;
   b) arranging the first mask parallel to and at a first distance from the substrate;
   c) providing a second mask with a first variable-transmission grating of alternating opaque and transparent linear features that has a period and a designed spatial variation of duty cycle;
   d) generating a beam of monochromatic light for illuminating the second mask so that diffracted beams are transmitted by the first variable-transmission grating;
   e) providing an optical arrangement between said second mask and said first mask such that only a 0th-order beam or a 1st-order beam of the diffracted beams illuminate the first high-resolution grating in the first mask and such that the 0th-order beam or 1st-order beam is well-collimated in a plane of incidence on the second mask that is orthogonal to the linear features of the first high-resolution grating;
   f) illuminating for a given exposure time the first variable-transmission grating with the illumination beam while varying the first distance according to displacement Talbot lithography, wherein a light-field transmitted by the first high-resolution grating exposes the photoresist to an energy density distribution for forming the desired surface-relief grating;
   wherein a spatial variation of duty cycle in the first variable-transmission grating is designed based on a predetermined dependence of the duty cycle of a surface-relief grating formed using displacement Talbot lithography on the energy density of the beam that illuminates the first mask in an absence of the second mask and according to the spatial variation of duty cycle of the desired surface-relief grating.

* * * * *